US011674986B2

(12) United States Patent
Forcet

(10) Patent No.: US 11,674,986 B2
(45) Date of Patent: Jun. 13, 2023

(54) VOLTAGE MEASUREMENT COMPENSATION IN HIGH VOLTAGE SYSTEMS

(71) Applicant: SCHNEIDER ELECTRIC INDUSTRIES SAS, Rueil Malmaison (FR)

(72) Inventor: Remi Andre Jean Forcet, Labrador (AU)

(73) Assignee: Schneider Electric Industries SAS, Rueil Malmaison (FR)

(*) Notice: Subject to any disclaimer, the term of this patent is extended or adjusted under 35 U.S.C. 154(b) by 636 days.

(21) Appl. No.: 16/578,803

(22) Filed: Sep. 23, 2019

(65) Prior Publication Data
US 2020/0326360 A1 Oct. 15, 2020

(30) Foreign Application Priority Data

Apr. 9, 2019 (AU) .................................. 2019901217
May 22, 2019 (AU) .................................. 2019203600

(51) Int. Cl.
G01R 25/00 (2006.01)
G01R 19/25 (2006.01)

(52) U.S. Cl.
CPC ..... *G01R 19/2506* (2013.01); *G01R 19/2513* (2013.01); *G01R 25/00* (2013.01)

(58) Field of Classification Search
CPC .... G01R 19/2506; G01R 19/25; G01R 19/00; G01R 19/2513; G01R 25/00; G01R 35/005; G01R 19/0084; G01R 19/2503; H01H 33/027
See application file for complete search history.

(56) References Cited

U.S. PATENT DOCUMENTS

| | | | |
|---|---|---|---|
| 6,717,395 B2 | 4/2004 | Skendzic et al. | |
| 2002/0180459 A1* | 12/2002 | Skendzic | G01R 15/06 324/628 |
| 2014/0340111 A1 | 11/2014 | Mercadal et al. | |
| 2015/0235790 A1 | 8/2015 | Stoving et al. | |
| 2017/0269134 A1* | 9/2017 | Fu | G01R 35/005 |
| 2020/0067568 A1* | 2/2020 | Spirkl | H04L 25/4917 |

OTHER PUBLICATIONS

Extended European Search Report dated Nov. 24, 2020 for EP Application No. 20162904.5-1010 / 3722819, 8 pages.

* cited by examiner

*Primary Examiner* — Mohamed Charioui
(74) *Attorney, Agent, or Firm* — Locke Lord LLP

(57) ABSTRACT

A method of obtaining characteristic measurements K and α of an electrical system comprising at least two terminals, the method comprising: injecting a reference voltage at a first of the at least two terminals; measuring a voltage at a second of the at least two terminals to provide a measured voltage, the second terminal being connected to earth; measuring a ratio of amplitude between the injected reference voltage and the measured voltage to provide a K value; and measuring a phase angle difference between the injected reference voltage and the measured voltage to provide an angle value α.

19 Claims, 19 Drawing Sheets

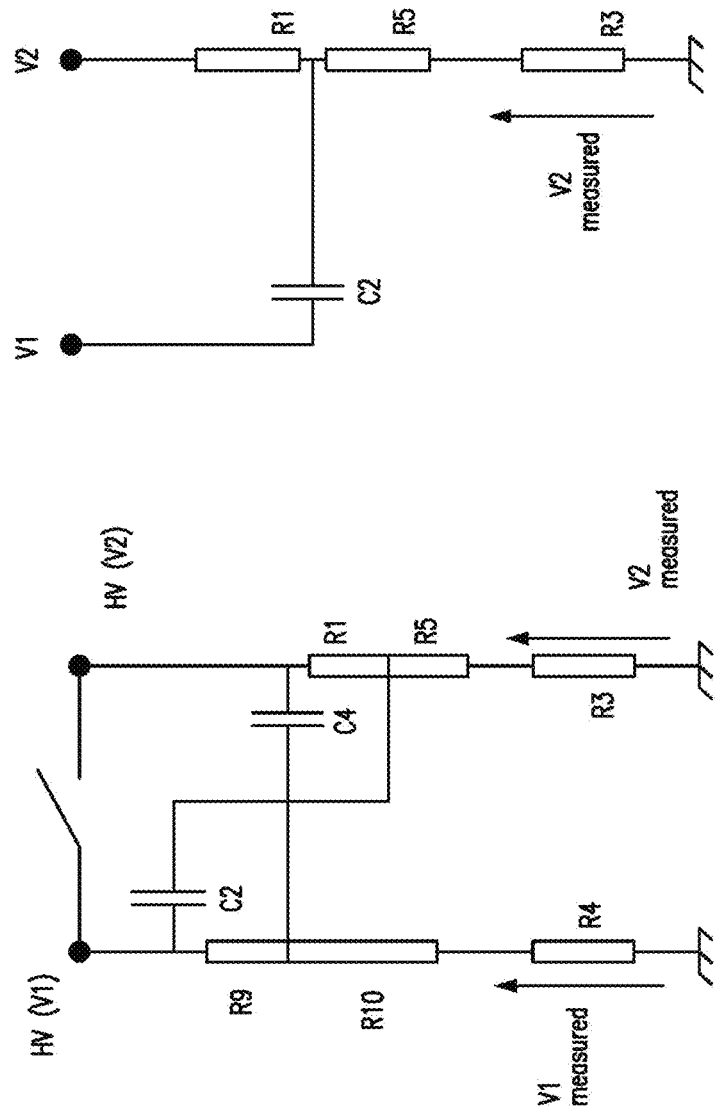

VOLTAGE MEASUREMENT COMPENSATION IN HIGH VOLTAGE SYSTEMS

PRIORITY

The present application claims priority from Australian Patent Application No. 2019203600 filed on 22 May 2019 and Australian Provisional Patent Application No. 2019901217 filed on 9 Apr. 2019.

The entire content of these priority applications is hereby incorporated by reference.

TECHNICAL FIELD

The present application relates to the effects of crosstalk on voltage measurements.

BACKGROUND

In any electrical system having two or more conductors sufficiently close to each other, the effect of current carried by one conductor will be felt by the other conductor due to the electromagnetic field generated by the current in the one conductor overlapping with the second conductor, thereby creating a current in the second conductor. This effect is known as crosstalk, and can create detrimental effects in the electrical system.

In electrical systems that have high voltages, such as electrical switchgear in electrical distribution systems, this effect is even greater. This effect will also affect the measurement of voltages in such systems due to capacitive coupling, making it difficult to obtain accurate voltage measurements due to the difficulty of shielding the voltage measurement circuit from this effect.

Inaccurate voltage measurements in such systems can prevent the implementation of certain functions or procedures, such as "Sync Check".

SUMMARY

According to a first aspect, there is provided a method of obtaining characteristic measurements K and α of an electrical system comprising at least two terminals, the method comprising: injecting a reference voltage at a first of the at least two terminals; measuring a voltage at a second of the at least two terminals to provide a measured voltage, the second terminal being connected to earth; measuring a ratio of amplitude between the injected reference voltage and the measured voltage to provide a K value; and measuring a phase angle difference between the injected reference voltage and the measured voltage to provide an angle value α.

According to a second aspect, there is provided a method of providing a compensated voltage measurement of a voltage measurement in an electrical system that includes an error resulting from crosstalk, the method comprising: receiving the voltage measurement of the electrical system; and removing at least a capacitive component of the error resulting from the crosstalk to provide the compensated voltage measurement.

According to a third aspect, there is provided a method of determining a compensation algorithm for compensating a voltage measurement of an electrical system, the compensation algorithm comprising one or more compensation coefficients; the method comprising deriving the one or more compensation coefficients from a characterised circuit of the electrical system.

According to a fourth aspect, there is provided a method for providing a compensated voltage measurement of a voltage measurement in an electrical system, the method comprising: measuring the voltage at a measuring terminal of the electrical system to provide the voltage measurement, and determining the compensated voltage measurement based on the voltage measurement and on at last one crosstalk coefficient calculated during an initial characterisation phase, wherein the initial characterisation phase comprises; injecting a reference voltage signal at a first terminal of the electrical system; measuring at the terminal, an capacitively coupled signal, from the reference voltage signal; comparing the reference voltage signal with a measured capacitively coupled signal; and calculating the at least one crosstalk coefficient based on the comparison of the reference voltage signal and the measured capacitively coupled signal.

According to a fifth aspect, there is provided a device for controlling an electrical system based on one or more voltage measurements of the electrical system, the device comprising; an input for receiving data corresponding to the one or more voltage measurements; a data processor for processing the received data and for generating data corresponding to a compensated voltage measurement; and an output for controlling the electrical system according to the compensated voltage measurement; wherein the processor contains executable software for causing the processor to perform one or more of the methods according to the second and fourth aspects.

According to a sixth aspect, there is provided a non-transitory computer-readable medium containing executable code for causing a processor to perform one or more of the methods according to the second and fourth aspects.

BRIEF DESCRIPTION OF DRAWINGS

Various aspects and embodiments will be discussed with reference to the accompanying drawings in which:

FIG. 6—shows a simpler representation of the circuit equivalent of FIG. 1B;

FIG. 7—shows the circuit of FIG. 6 showing one source V1 and one resulting crosstalk V2;

DESCRIPTION OF EMBODIMENTS

Figure 1A:
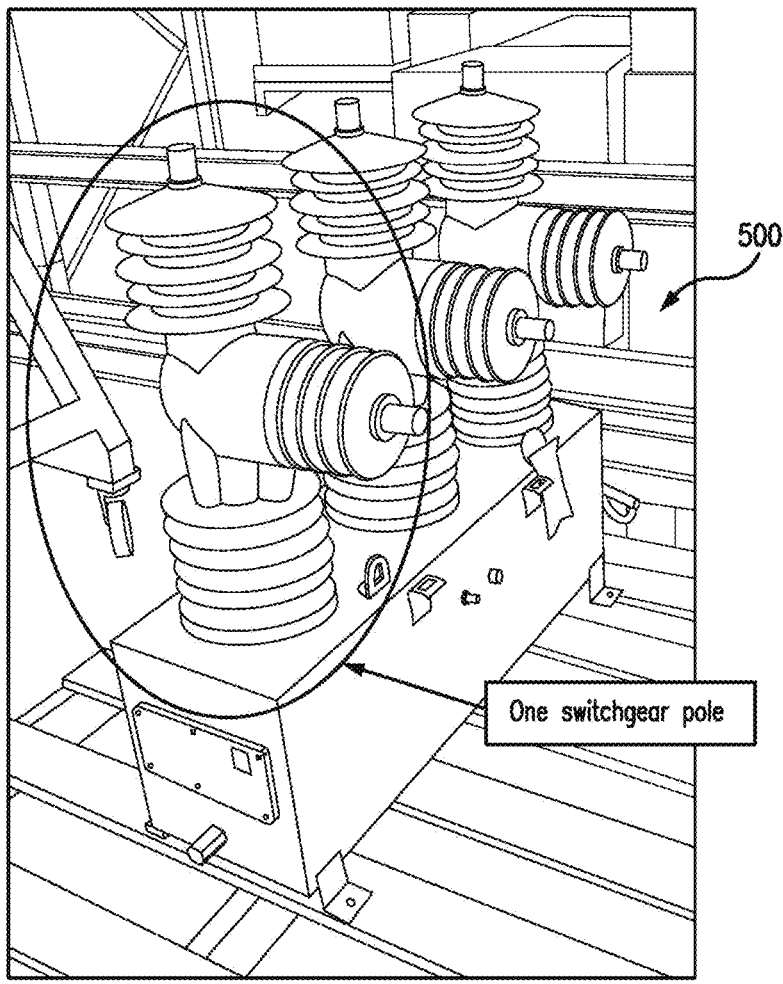
FIG. 1A—shows a photograph of an embodiment of an electrical system, particularly, a medium voltage switchgear, to which aspects described herein can be applied.
Figures 1B, 1C:
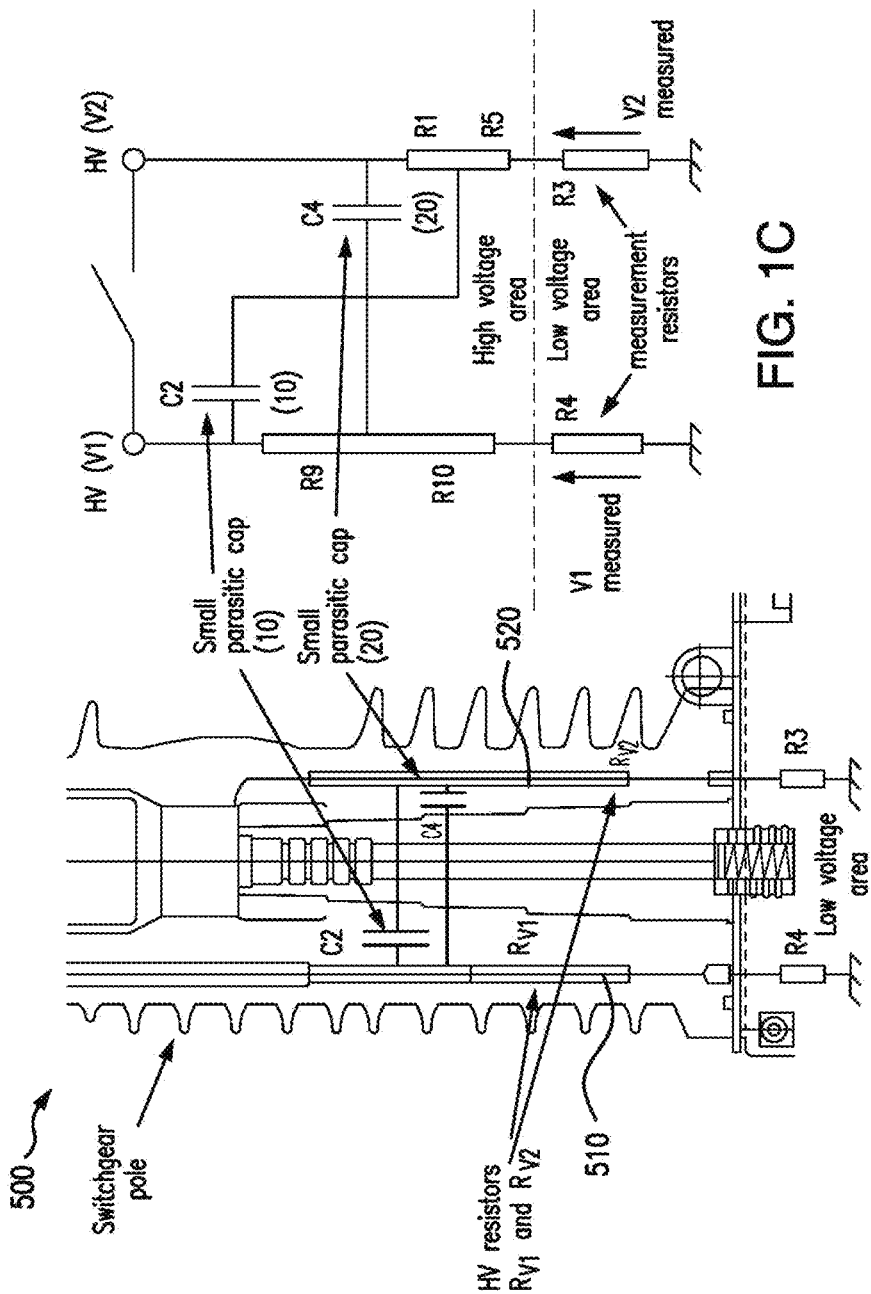
FIG. 1B—shows an internal schematic of one pole of the electrical system of FIG. 1A.
FIG. 1C—shows a circuit equivalent of the impedances of the electrical system of FIG. 1B.

FIG. 1A shows an example of an electrical system 500 to which the various aspects described herein can be applied. In this example, the electrical system 500 is a medium voltage switchgear pole. FIG. 1B shows the switchgear 500 (specifically, one pole of the switchgear as shown in FIG. 1A) with two HV resistors 510, 520. Shown in this view are two parasitic capacitances 10, 20 which exist between the two resistors 510, 520.

FIG. 1C shows a simplified circuit equivalent with Resistive Voltage Dividers (RVDs) being formed by the HV resistors 510, 520 of FIG. 1A and resistors R3, R4, and also showing the parasitic capacitances 10, 20.

Figure 2:
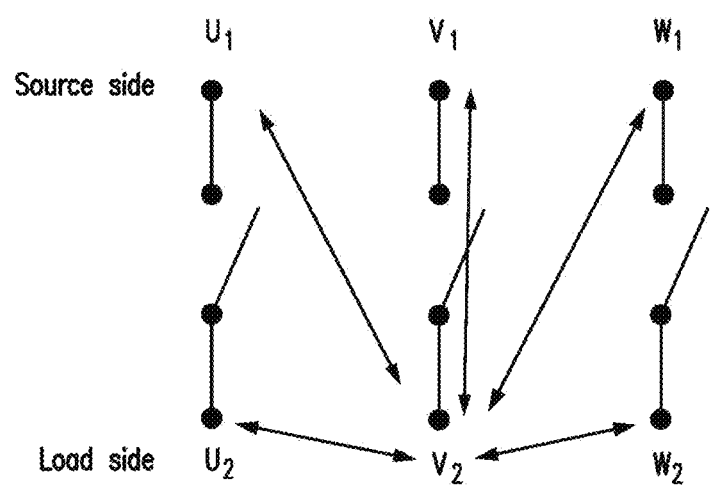
FIG. 2—shows a representation of the crosstalk effect of all other voltages in the electrical system on the measured voltage V2.

FIG. 2 shows a representative illustration of the effects on a particular voltage measurement V2 on the load side in a multi-phase electrical system such as switchgear 500, of the voltage V1 on the source side of the same phase, as well as the voltages U1, U2, W1, W2 of the source side and load side of the other 2 phases.

In practice, a measurement of the voltage V2 will be affected by the presence of these other voltages (V1, U1, U2, W1, W2), resulting in an error in the measured voltage. This error can adversely affect the operation of the electrical system 500, for example, preventing the safe implementation of "Sync Check" to ensure safe operation of switches in the system.

Various aspects described herein allow the identification and compensation of the effects of the crosstalk from these other voltage sources, so as to provide a compensated voltage measurement that more accurately reflects the actual voltage at the point of measurement.

Figure 3:
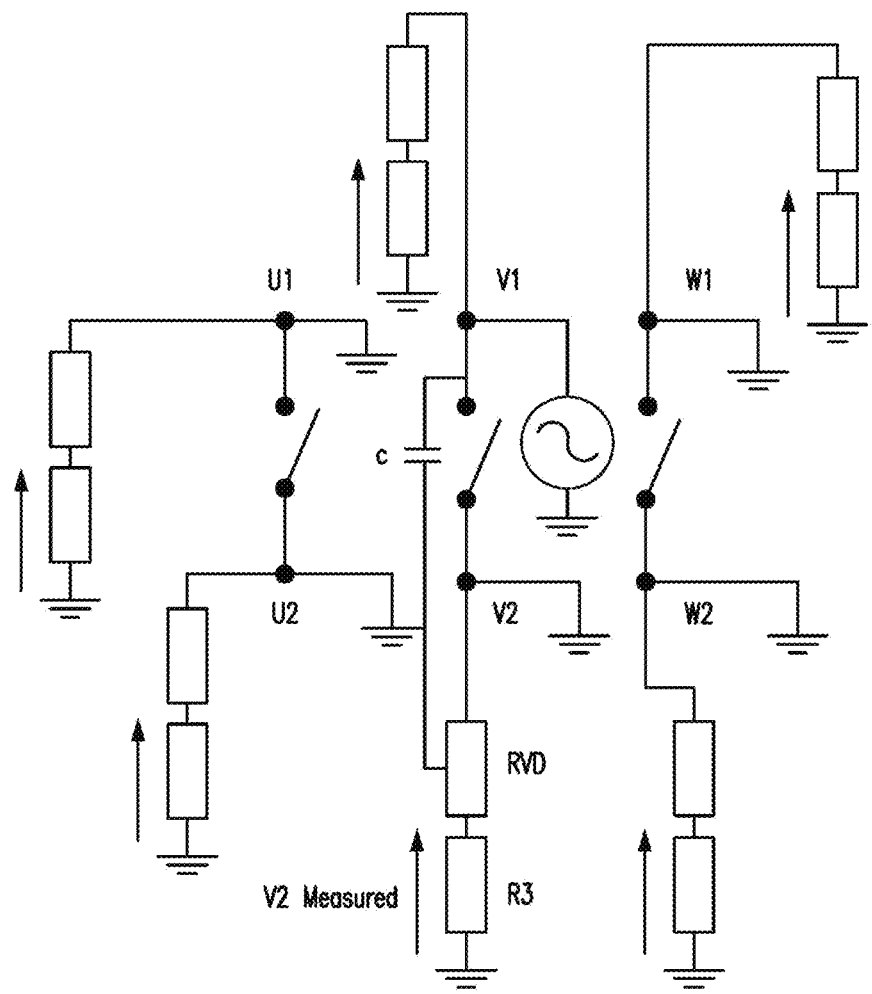
FIG. 3—shows a representation a circuit, showing how the measurement is made on R3, with a current created by the RVD resistor as shown in FIG. 2.

FIG. 3 shows an equivalent circuit of the electrical system of FIGS. 1A, 1B and 1C, to illustrate a step of measuring the effects of different voltages on a measured voltage according to some aspects. In the example illustrated in FIG. 3, the effects of the voltage V1, on the measured voltage V2measured is performed by injecting a known reference voltage signal V1 in the circuit as shown. Resistor RVD is the effective resistance of the electrical system in that path represented by Rv1 and Rv2 in FIG. 1B (Rv1=R9+R10 and Rv2=R1+R5) in FIG. 1C, and R3 is the resistance of the voltage measurement circuit.

In this aspect, voltage measurement errors are used to characterise each electrical system (e.g. a switchgear) to allow the generation of an algorithm for use in providing compensated voltage measurements for each terminal or bushing of the electrical system 500.

When applying or injecting a reference voltage on one bushing, it will be seen that the voltage measured on all other bushings connected to earth is not zero. This is due to the parasitic capacitance C that is injecting a current $C \cdot d(U_C)/dt$ in the measurement resistor R3 as shown in FIG. 3.

Figure 4:
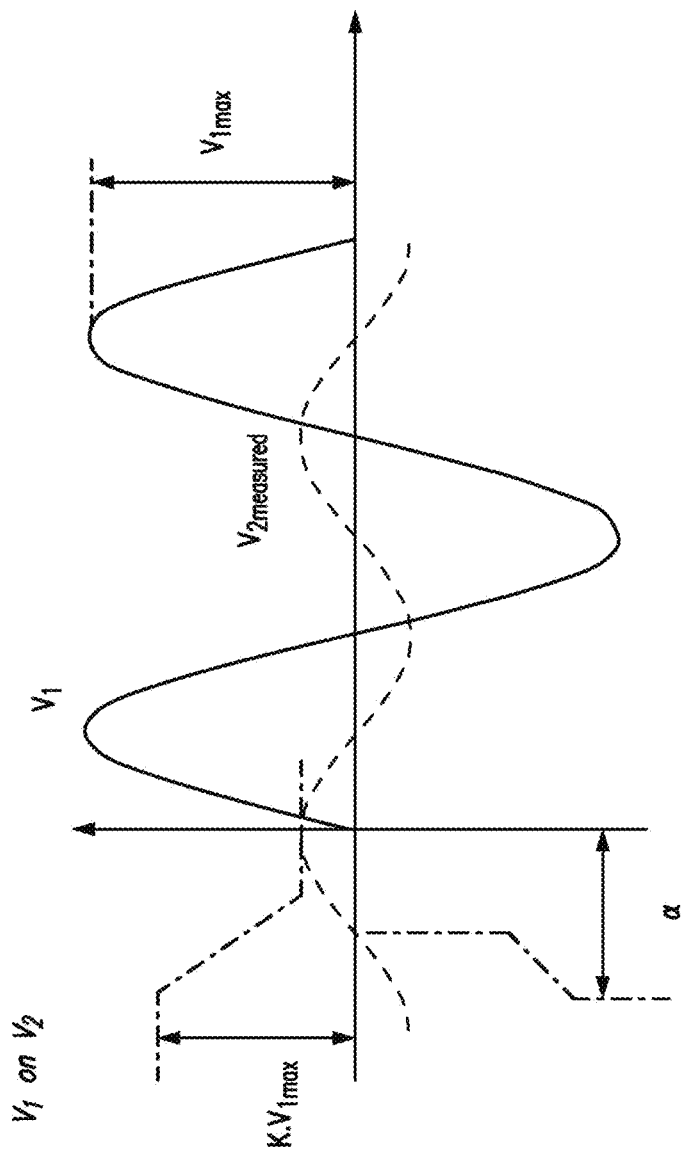
FIG. 4—shows the waveforms of the injected voltage signal V1 and the measured voltage signal V2, being the error waveform created by the crosstalk effect of V1 on V2measured.

FIG. 4 shows a plot of the waveform of injected reference voltage V1 and the resulting measured voltage V2measured from FIG. 3. From this plot, characteristics of the error waveform (V2measured) can be determined for use in characterising the electrical system and calculating coefficients for use in an algorithm for providing a compensated voltage measurement. In particular, from this plot of FIG. 4, a value K, being the ratio of the injected signal V1 and the error signal of V2measured can be determined, as can the phase difference α between the injected reference signal V1 and the error signal of V2measured. In this aspect, the error signal resulting from the crosstalk is also referred to as the capacitively coupled voltage or Vcrosstalk, and which is the signal measured during this characterisation phase with the measured terminal connected to earth.

Once obtained, these values can be used in a number of different ways to provide a compensated voltage measurement to remove at least a portion of the error signal introduced by the crosstalk effect, as will be described in more detail below.

FIGS. 3 and 4 show the procedure to determine the effect of V1 on measured voltage V2. To take into account the effects of all voltages in the electrical system on V2, the same procedure is undertaken for all other voltages. For example to determine the effect of U1 on V2, a reference signal U1 is injected at the terminal for U1, with all other terminals or bushing connected to ground, and the signal at V2 is measured. These results provide waveforms as shown in FIG. 4, with injected signal U1 instead of injected signal V1.

Once all combinations of voltage pairings have been measured on V2 (resulting in 5 groups of K and α measurements), the same procedure is carried out for each of the other voltages, U1, U2, V1, W1 and W2. Upon completion of all measurements, 30 crosstalk (K) and angle (α) values will have been obtained as shown in the table below:

| U2 | V2 | W2 | U1 | V1 | W1 |
|---|---|---|---|---|---|
| U1U2 | V1V2 | U1W2 | U2U1 | U2V1 | U2W1 |
| V1U2 | U1V2 | V1W2 | V2U1 | V2V1 | V2W1 |
| W1U2 | W1V2 | W1W2 | W2U1 | W2V1 | W2W1 |
| V2U2 | U2V2 | U2W2 | V1U1 | U1V1 | U1W1 |
| W2U2 | W2V2 | V2W2 | W1U1 | W1V1 | V1W1 |

It will be appreciated that in some embodiments, a calibration step can be carried out prior to beginning the procedures described above to ensure that all phases are receiving the same injected voltage. In some embodiments, the calibration step may be done after the crosstalk compensation.

Figure 5:
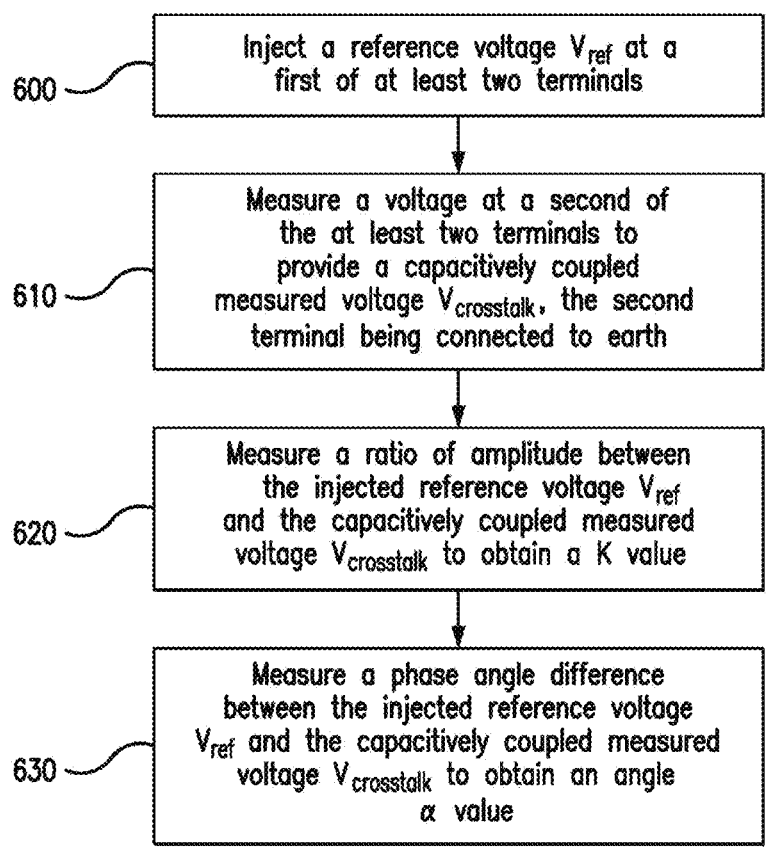
FIG. 5—shows a flowchart of a method of characterising the crosstalk voltage in order to obtain crosstalk coefficients for use in a compensation algorithm.

In a broad form then, as shown in FIG. 5, there is provided a method of obtaining characteristic measurements K and α of an electrical system comprising at least two terminals (in some embodiments, there are at least three terminals, including a common terminal), the method comprising, at step 600, injecting a reference voltage at a first of the at least two terminals; at step 610, measuring a capacitively coupled voltage at a second of the at least two terminals to provide an capacitively coupled voltage, the second terminal being connected to earth; at step 620, measuring a ratio of amplitude between the injected reference voltage and the capacitively coupled voltage to provide a K value; and at step 630, measuring a phase angle difference between the injected reference voltage and the capacitively coupled voltage to provide an angle value α.

In some embodiments, where there are more than 2 terminals, the above steps are carried out for each terminal pair so as to obtain a K value and an angle α value for each terminal pair as previously described. For example if there are 2 terminals T1 and T2, the above steps are carried out twice, one for T1T2 (i.e. inject reference voltage $V_{ref}$ at T1 and measure capacitively coupled voltage $V_{crosstalk}$ at T2) and once for T2T1 (i.e. inject reference voltage $V_{ref}$ at T2 and measure capacitively coupled voltage $V_{crosstalk}$ at T1). For three terminals T1, T2 and T3, the pairings will be T1T2, T2T1, T2T3, T3T2, T1T3 and T3T1. It will be appreciated that the parameters measured at the terminals is the voltage at the terminal, and so V1 is the voltage at terminal T1, V2 is the voltage at terminal T2 etc., and so these pairings can equally be written V1V2, V2V1, V2V3, V3V2, V1V3 and V3V1 as previously described.

Once the above procedure has been carried out, and one or more voltage pair measurements have been obtained to provide respective characteristic measurements K and α values, various means of generating a compensated voltage measurement may be implemented according to various aspects. These aspects will now be described in detail with respect to the voltage pairing of V1V2 (i.e. the effect of voltage V1 on measured voltage V2), however, it will be appreciated that the same procedures may be applied to one or more other voltage pairings to provide an at least partially compensated voltage measurement.

It will also be appreciated that although greatest effect will be had by applying the various techniques to all voltage pairings in the electrical system, some portion of the error from the crosstalk on a particular voltage measurement can be removed or compensated for if applied to even one voltage pairing. For example, the process can be applied to the effects of V1 on V2 (V1V2) only; or the effects of V1 on V2 (V1V2), W1 on V2 (W1V2) and U1V2 (U1V2); or the effects of U2 on V2 (U2V2) only.

According to one aspect, the K and α values obtained from the above process can be used to determine compensation coefficients for use in a compensation algorithm as shown in equation 1:

$$V2comp = V2measured - \left[ KC_{U1V2} * \frac{dU1 - K2_{U1V2}*dV2}{dt} + \right. \tag{1}$$

$$KC_{V1V2} * \frac{dV1 - K2_{V1V2}d*V2}{dt} +$$

-continued $$KC_{W1V2} * \frac{dW1 - K2_{W1V2}*dV2}{dt} + KC_{U2V2} *$$

$$\left. \frac{dU2 - K2_{U2V2}*dV2}{dt} + KC_{W2V2} * \frac{dW2 - K2_{W2V2}*dV2}{dt} \right]$$

Where:
V2comp is the compensated voltage measurement of the measurement of V2;
V2measured is the voltage measured
KcU1V2 is the capacitance coefficient determined for the effect of U1 on V2
KcV1V2 is the capacitance coefficient determined for the effect of V1 on V2
KcW1V2 is the capacitance coefficient determined for the effect of W1 on V2
KcU2V2 is the capacitance coefficient determined for the effect of U2 on V2
KcW2V2 is the capacitance coefficient determined for the effect of W2 on V2
Kc and K2xx can be calculated during the circuit characterisation phase from K2=(R5+R3)/(R1+R5+R3) for the capacitive crosstalk (see further below for more detail on circuit characterisation)

Once the coefficients have been calculated for a given electrical system, the above equation can be used in real time as a voltage measurement is taken of the electrical assembly in use. In particular, as the raw voltage measurements are taken at the terminals of the electrical system, U1, U2, V1, V2, W1 and W2, according to an aspect, a calculation is made to determine the voltage variation (dv) difference with the previous sample taken, which provides the dv/dt values for the equation above. In practice, the time difference between raw voltage measurements is provided by the sampling rate of the device making the measurements as will be described in more detail further below.

According to other embodiments, the compensation algorithm is provided by:

$$V2_{comp} = V2_{measured} - P_{V1V2}\left[ K1_{V1V2} * \text{Sin}(\alpha) * \frac{dV1 - K2_{V1V2}*dV2}{dt} + \right. \tag{2}$$

$$\left. \text{Cos}(\alpha)*(V1 - K2_{V1V2}*V2) \right]$$

where:
V2comp is the compensated voltage measurement of the measurement of V2;
V2measured is the voltage measured;
$P_{V1V2}$ is the percentage of crosstalk on V2 from V1
A is the measured angle
$K1_{V1V2}=10/2\pi \cdot f$ (t in ms);
$K2_{V1V2}=(R5+R3)/(R1+R5+R3)$
A full derivation of this equation (2) is provided below with reference to FIGS. 8 to 11.

When removing the error from all bushings, equation (2) becomes:

$$V2_{comp} = \tag{3}$$

$$V2_{measured} - \left\{ P_{U1V2} * \left[ K1_{U1V2} * \text{Sin}(\alpha) * \frac{dU1 - K2_{U1V2}*dV2}{dt} + \right. \right.$$

$$\left. \text{Cos}(\alpha)*(U1 - K2_{U1V2}*V2) \right] +$$

-continued $$P_{V1V2}\left[K1_{V1V2} * \text{Sin}(\alpha) * \frac{dV1 - K2_{V1V2} * dV2}{dt} + \right.$$
$$\left.\text{Cos}(\alpha) * (V1 - K2_{V1V2} * V2)\right] +$$
$$P_{W1V2}\left[K1_{W1V2} * \text{Sin}(\alpha) * \frac{dW1 - K2_{W1V2} * dV2}{dt} + \right.$$
$$\left.\text{Cos}(\alpha) * (W1 - K2_{W1V2} * V2)\right] +$$
$$P_{U2V2}\left[K1_{U2V2} * \text{Sin}(\alpha) * \frac{dU2 - K2_{U2V2} * dV2}{dt} + \right.$$
$$\left.\text{Cos}(\alpha) * (U2 - K2_{U2V2} * V2)\right] +$$
$$P_{W2V2}\left[K1_{W2V2} * \text{Sin}(\alpha) * \frac{dW2 - K2_{W2V2} * dV2}{dt} + \right.$$
$$\left.\left.\text{Cos}(\alpha) * (W2 - K2_{W2V2} * W2)\right]\right\}$$

In some embodiments, when α is close to 90 degrees (for example between 80 degrees and 90 degrees), the resistive component of the crosstalk error is negligible, and equation (3) can be modified to remove only the capacitive component of the error from the crosstalk, and can be simplified to:

$$V2_{comp} = \qquad (4)$$
$$V2_{measured} - \left[P_{U1V2} * K1_{U1V2} * \frac{dU1 - K2_{U1V2} * dV2}{dt} + P_{V1V2} * K1_{V1V2} * \right.$$
$$\frac{dV1 - K2_{V1V2} * dV2}{dt} + P_{W1V2} * K1_{W1V2} * \frac{dW1 - K2_{W1V2} * dV2}{dt} +$$
$$P_{U2V2} * K1_{U2V2} * \frac{dU2 - K2_{U2V2} * dV2}{dt} +$$
$$\left.P_{W2V2} * K1_{W2V2} * \frac{dW2 - K2_{W2V2} * dV2}{dt}\right]$$

In some embodiments, when only the capacitive component is removed and the K2xx coefficient=1, equation (4) can be further simplified to:

$$V2_{comp} = V2_{measured} - \left[P_{U1V2} * K1_{U1V2} * \frac{dU1 - dV2}{dt} + \right. \qquad (5)$$
$$P_{V1V2} * K1_{V1V2} * \frac{dV1 - dV2}{dt} + P_{W1V2} * K1_{W1V2} * \frac{dW1 - dV2}{dt} +$$
$$\left.P_{U2V2} * K1_{U2V2} * \frac{dU2 - dV2}{dt} + P_{W2V2} * K1_{W2V2} * \frac{dW2 - dV2}{dt}\right]$$

The compensated values may then be stored in memory, displayed on a display screen and/or used in controlling further functions of the electrical system 500 such as Sync check.

This compensating procedure can be used to provide more accurate voltage measurements in real time as the electrical system 500 (being in this example, the full recloser system 500 shown in FIG. 1A) is operating, so as to reduce deleterious effects of crosstalk on the voltage measurements in functions such as Sync check. During sync check, the utility adjusts the amplitude and waits for the signal to be in phase before closing the switch. Without the compensation, the amplitude would not be reliable in this situation.

In some embodiments in which the system is a single phase system, with only 2 terminals providing voltages V1 and V2, use of only the components relating to the V2V1 relationship and the V1V2 relationship are used. In such embodiments, the equation becomes:

$$V2comp = V2\text{measured} - \left[KC_{V1V2} * \frac{dV1 - K2_{V1V2}dV2}{dt}\right] \qquad (6)$$

and $$V1comp = V1\text{measured} - \left[KC_{V2V1} \times \frac{dV2 - K2_{V2V1}dV1}{dt}\right] \qquad (7)$$

In other embodiments, in multi-phase systems, it will be appreciated that benefit can still be obtained by obtaining a more accurate compensated measurement by using only one or more other measurements of the other phases. For example, an improved compensated V2 measurement can be obtained by considering only the effects of U1 and V1, or W1 and V1 or U2 and W2.

Any consideration of the effect of any one or more other voltages on a measured voltage and removal of at least a part of that effect, will provide a voltage value closer to the real value and thus provide a benefit.

In other aspects, further refinement can be obtained by using a recursive approach to further refine the compensated voltage. In these aspects, the following algorithm may be used:

$$V2comp_2 = \qquad (8)$$
$$V2\text{measured} - \left[KcU1V2 * \frac{dU1comp - k2U1V2 * dV2comp}{dt} + \right.$$
$$KcV1V2 * \frac{dV1comp - k2V1V2 * dV2comp}{dt} +$$
$$KcW1V2 * \frac{dW1comp - k2W1V2dV2comp}{dt} +$$
$$KcU2V2 * \frac{dU2comp - k2U2V2 * dV2comp}{dt} +$$
$$\left.KcW2V2 * \frac{dW2comp - k2W2V2 * dV2comp}{dt}\right]$$

In some cases, in which the measured angle α value is close to 90° (for example about 85°, about 86°, about 87°, about 88° or about 89°), then the resistive effect is negligible as described above, and be ignored. In other cases where the measured angle α value is lower, such as between about 30° and about 40°, between about 40° and about 50°, between about 50° and about 60° and between about 60° and about 70°), the resistive effect is more prevalent and can be taken into account when removing the error signal. It will be appreciated that for each electrical system and DSP capabilities available, a determination may be made as to what angle will be considered to be sufficiently close to 90 degrees so as to ignore the resistive component. In some of these embodiments, the resistive component KR is obtained from $$\frac{V1 - K2_{V1V2} * V2}{KR_{V1V2}} = P_{V1V2} \cdot \text{Cos}(\alpha) * (V1 - k2 * V2) \qquad (9)$$

where $P_{V1V2}$ (Percentage of crosstalk) and α are obtained from the measurements described above with reference to FIGS. 2 to 5 (Note that k2*V2=0 when V2 is connected to the ground).

In such applications, the equation incorporates the resistive components as well:

In a simple form, considering the effect of V1 on V2, the equation becomes $$V2comp = V2\text{measured} - \left[ KC_{V1V2} * \frac{dV1 - K2_{V1V2}*dV2}{dt} + \frac{V1 - K2_{V1V2}*V2}{KR_{V1V2}} \right] \quad (10)$$

For a more complete compensation taking into account all of the pairings in the electrical system 500, the following equation may be used $$V2comp = V2\text{measured} - \left[ Kc_{U1V2} * \frac{dU1 - K2_{U1V2}*dV2}{dt} + \right. \quad (11)$$
$$Kc_{V1V2} * \frac{dV1 - K2_{V1V2}*dV2}{dt} + Kc_{W1V2} * \frac{dW1 - K2_{W1V2}*dV2}{dt} +$$
$$Kc_{U2V2} * \frac{dU2 - K2_{U2V2}*dV2}{dt} + Kc_{W2V2} * \frac{dW2 - K2_{W2V2}*dV2}{dt} +$$
$$\frac{U1 - K2_{U1V2}*V2}{KR_{U1V2}} + \frac{V1 - K2_{V1V2}*V2}{KR_{V1V2}} +$$
$$\left. \frac{W1 - K2_{W1V2}*V2}{KR_{W1V2}} + \frac{U2 - K2_{U2V2}*V2}{2KR_{U2V2}} + \frac{W2 - K2_{W2V2}*V2}{2KR_{W2V2}} \right]$$

In other aspects, even further refinement may be obtained by using higher orders including $2^{nd}$ order, $3^{rd}$ order, $4^{th}$ order, $5^{th}$ order and higher.

A $2^{nd}$ order equation including the resistive components is provided as:

$$V2comp_2 = \quad (12)$$
$$V2\text{measured} - \left[ KcU1V2 * \frac{dU1comp - k2U1V2*dV2comp}{dt} + \right.$$
$$KcV1V2 * \frac{dV1comp - k2V1V2*dV2comp}{dt} +$$
$$KcW1V2 * \frac{dW1comp - k2W1V2dV2comp}{dt} +$$
$$KcU2V2 * \frac{dU2comp - k2U2V2*dV2comp}{dt} +$$
$$KcW2V2 * \frac{dW2comp - k2W2V2*dV2comp}{dt} +$$
$$\frac{U1comp - K2_{U1V2}*V2comp}{KR_{U1V2}} + \frac{V1comp - K2_{V1V2}*V2comp}{KR_{V1V2}} +$$
$$\frac{W1comp - K2_{W1V2}*V2comp}{KR_{W1V2}} +$$
$$\left. \frac{U2comp - K2_{U2V2}*V2comp}{KR_{U2V2}} + \frac{W2comp - K2_{W2V2}*V2comp}{KR_{W2V2}} \right]$$

According to other aspects, rather than obtaining the compensation coefficients, being the capacitive and resistive coefficients from K sin α and K cos α as previously described, the K and α values obtained as previously described may be used to characterise the electrical system by explicitly calculating the values of all of the internal impedances R1, R5 and C of the electrical system. These calculated impedance values may then be used to derive the compensation coefficients as described below.

Figure 9:
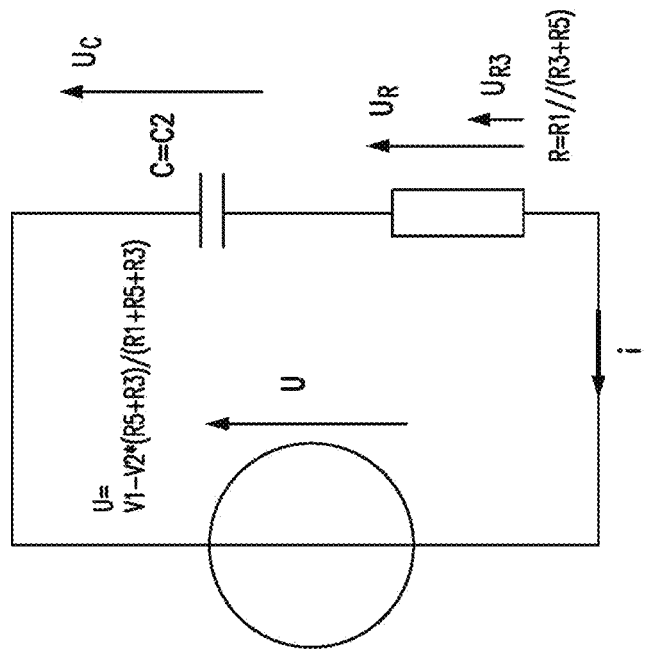
FIG. 9—shows a Thevenin equivalent circuit of FIG. 8 relating to the crosstalk effect for use in calculating circuit impedances.
Figure 8:
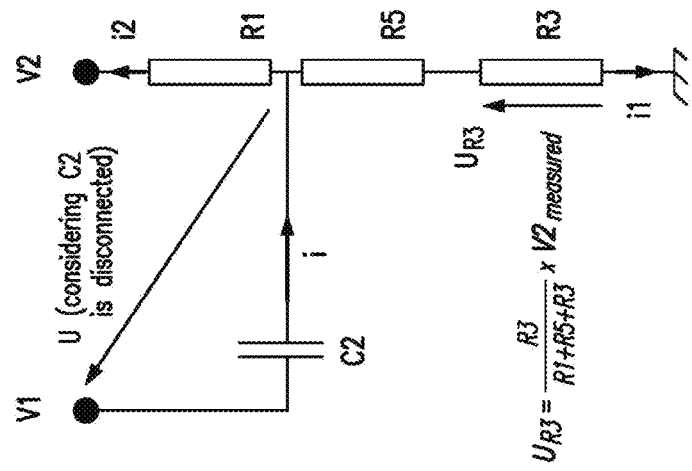
FIG. 8—shows the circuit of FIG. 7 used in calculating circuit impedances.
Figure 10:
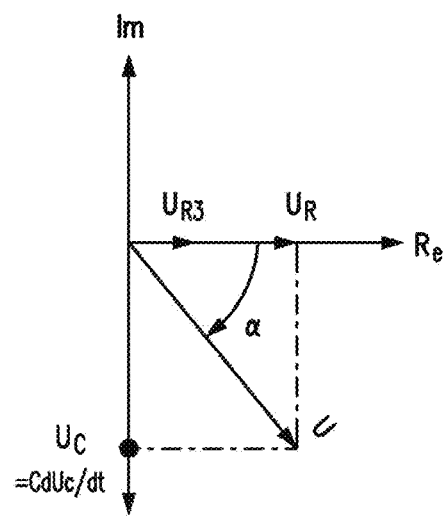
FIG. 10—shows a polar diagram of U for use in calculating circuit impedances.
Figure 11:
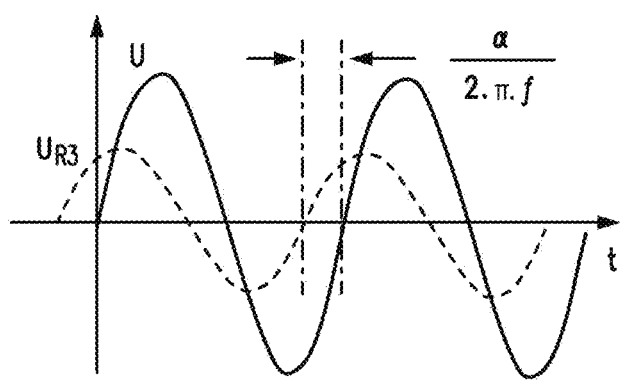
FIG. 11—shows the waveforms for U and UR3 from the circuits of FIGS. 8 to 10.

FIGS. 6 to 11 are used to derive these impedance values. FIG. 6 shows a simpler representation of the circuit equivalent of FIG. 1B. FIG. 7 shows the circuit of FIG. 6 showing one source V1 and one resulting crosstalk V2. FIG. 8 shows an equivalent schematic for one phase of the electrical system or switchgear 500 and FIG. 9 shows this simplified schematic transformed into an equivalent Thevenin model. FIG. 10 shows a phasor diagram for U and FIG. 11 shows the waveforms for the components U and $U_{R3}$.

From these figures, it can be seen that V2measured=V2+ an Error (E), where the error E is provided by $$E = A \cdot R3 \cdot i1 = Kc \, dUc/dt$$

With $Uc = U - U_R$ and $U = V1 - k2 \cdot V2$

If UR<<Uc, then E=Kc·(dV1/dt−k2·dV2/dt) when the crosstalk is predominantly capacitive, with K2=(R5+R3)/(R1+R5+R3) and Kc=K1·Pc (with Pc being the crosstalk in % and K1=(10/2π)f) considering t is in milliseconds.

It will be appreciated that in most cases, the measurement resistor values R3 are much smaller than the HV resistors R1 and R5, i.e. R3 is negligible. It will also be appreciated that usually, Zc<<R therefore Uc≈U. In this case, the effect of R on the crosstalk is negligible and the crosstalk is predominantly capacitive.

Accordingly, in these cases, the error voltage for one terminal/bushing can be expressed as:

$$E = Kc \cdot \left( \frac{dV1}{dt} - k2 \cdot \frac{dV2}{dt} \right)$$

An equivalent circuit of the electrical system can be generated, and, knowing the input parameters Input voltage, frequency, percentage of crosstalk measured (K), angle α measured), RVD and R3, all of the internal impedances R1, R5 and C can be calculated.

The following equations provide the relevant relationships to calculate the impedances:

$$R1 = \gamma RVD \text{ where } \gamma = i1/i$$

$$R5 = RVD - R1$$

These relationships will be derived further below.

Figure 12:
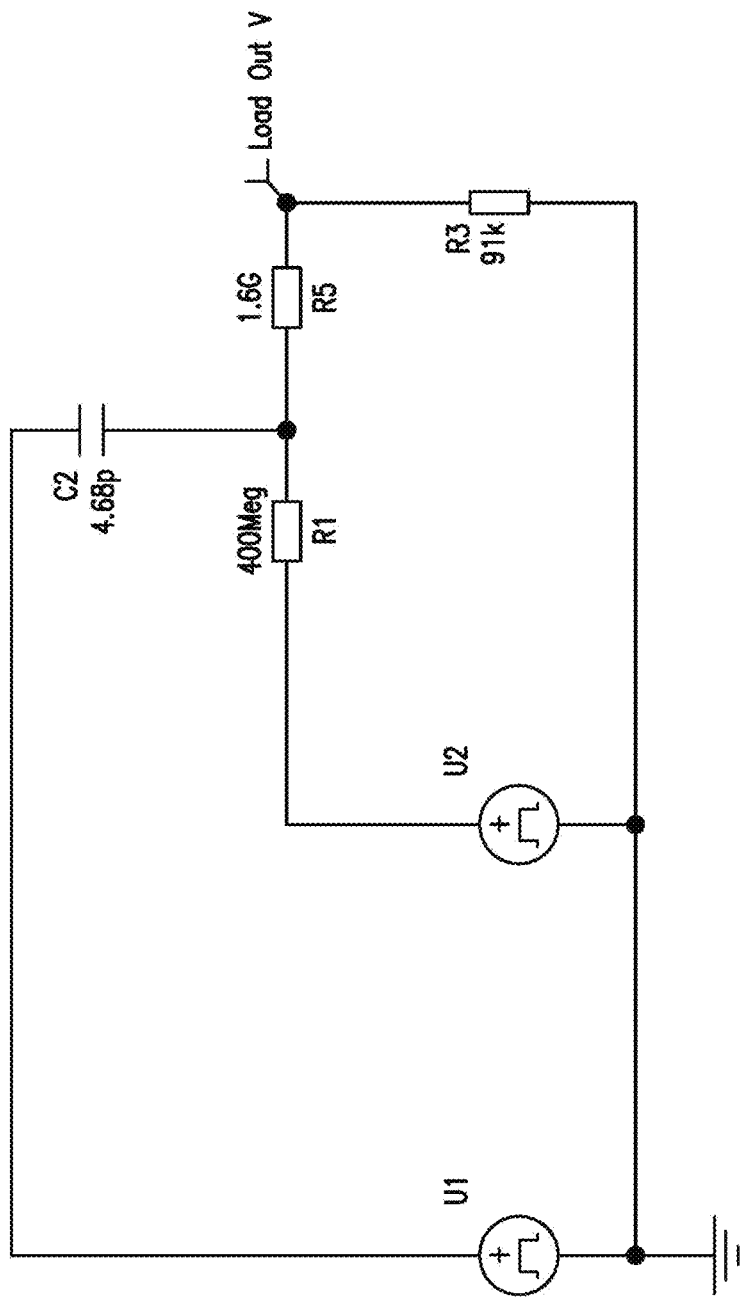
FIG. 12—shows a circuit of the circuit of FIG. 8 showing the calculated impedances.

From these calculated internal impedance, an equivalent circuit can be determined. FIG. 12 shows an equivalent circuit of the model of FIG. 8 with the known inputs U1max−100V, U1 crosstalk on U2=52.85%, U1/U2 angle=65°, RVD=2 GOhms, R3=91 kOhms, frequency=50 Hz and sampling frequency=20 ks/s. Using the equations above (and the derivations below), the internal impedances were calculated to be R1=400 MOhms, R5=1600 MOhms and C=4.63 pF.

In yet another possible method of characterising the circuit, impedances of the circuit may be calculated by injecting a step function at U1 and measuring the impulse response at U2 with the U2 terminal grounded as previously described with reference to FIGS. 2 to 4. In this aspect, the waveforms of FIG. 4 are replaced by the waveforms shown in FIGS. 13A and 13B.

Figure 13A:
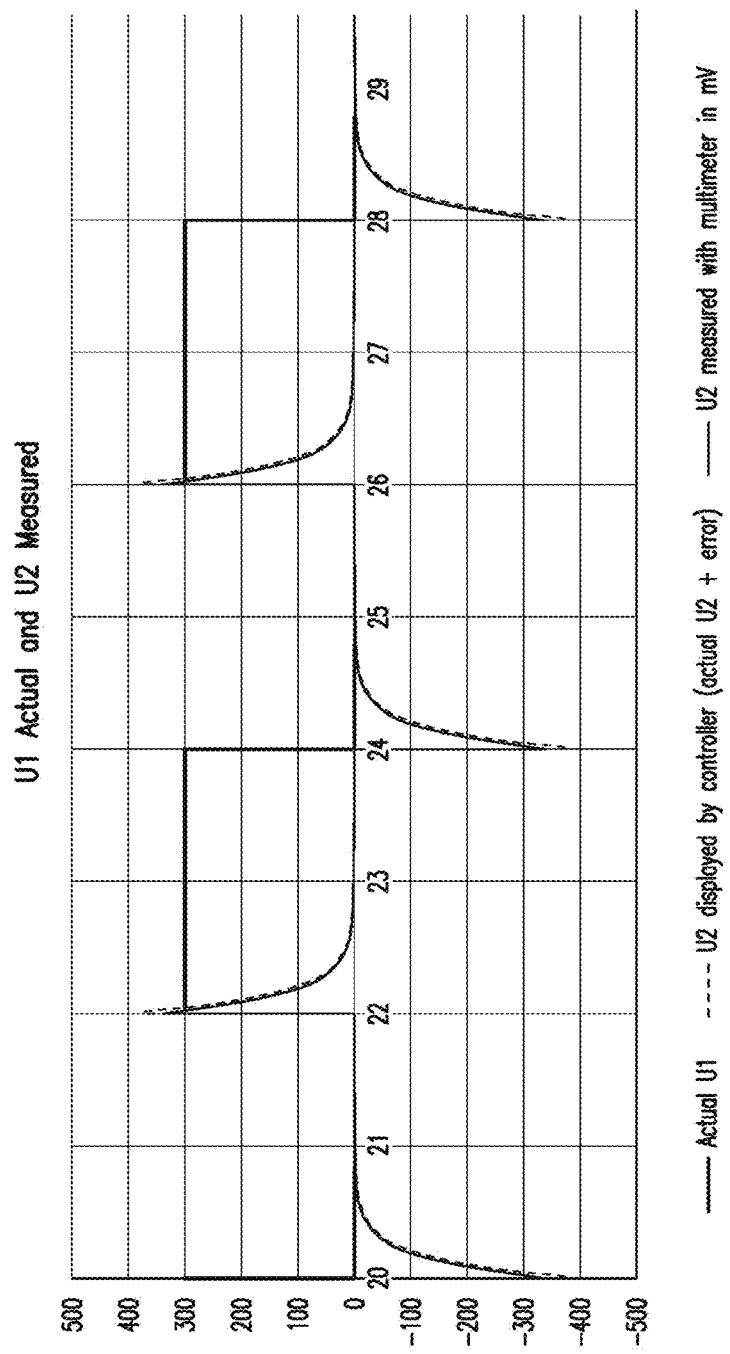
FIG. 13A—shows the waveforms of injecting a step function for U1 and the response waveform U2measured in another embodiment of characterising the circuit.

FIG. 13A shows the response U2 of a square signal injected on U1 (U1=300V square wave at 500 Hz). Knowing Max UR3 (the value of R3 is provided by the manufacturer, or can be easily measured directly), R5 can be determined with the equation:

$$\text{Max}UR3 = U1 \cdot R3/(R5+R3)$$

From there, R1 can also be found using:

$$R1 = RVD - R5; \text{ and}$$

$$R = R1//(R5+R3)$$

Figure 13B:
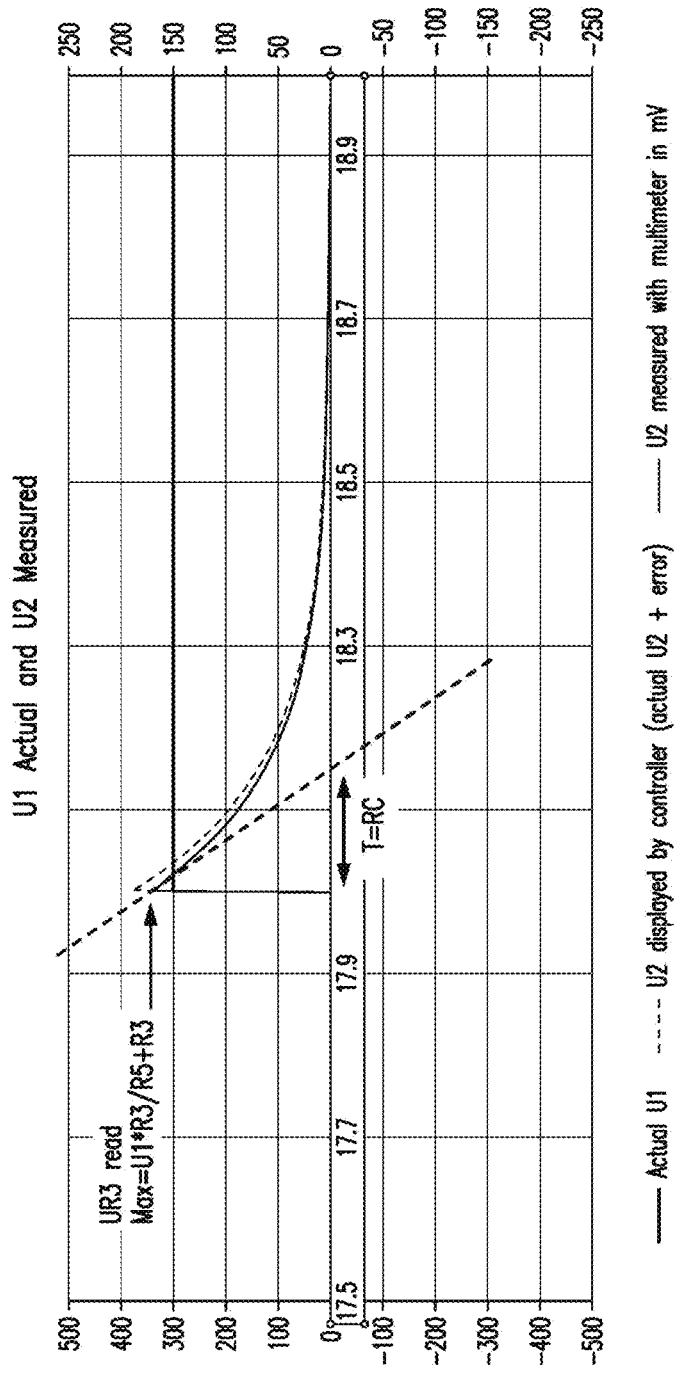
FIG. 13B—shows the use of the waveforms of FIG. 13A in calculating characterising parameters.

Furthermore, as seen in FIG. 13B, C can then be found using the response waveform time constant RC with T=RC from FIG. 13B.

Knowing the internal impedances of the characterised circuit, the Error E can be calculated and removed for each voltage pairing. E can be determined using the following relationships:

$$Kc = K1Pc$$

with K1=10 f/2π and Pc=percentage crosstalk K (measured in the method described above with reference to FIGS. 2 to 5)

$$K2 = (R5+R3)/(R1+R5+R3)$$

Accordingly, the following equation can be used to compensate the measured voltages Vmeas at a terminal, to provide a compensated voltage that reduces at least a portion of the error caused by crosstalk in the system:

$$V2_{comp} = V2_{measured} - [KC_{U1V2} \times \left(\frac{dU1}{dt} - K2_{U1V2}\frac{dV2}{dt}\right) +$$

$$KC_{V1V2} \times \left(\frac{dV1}{dt} - K2_{V1V2}\frac{dV2}{dt}\right) + KC_{W1V2} \times \left(\frac{dW1}{dt} - K2_{w1V2}\frac{dV2}{dt}\right) +$$

$$KC_{U2V2} \times \left(\frac{dU2}{dt} - K2_{u2V2}\frac{dV2}{dt}\right) + KC_{W2V2} \times \left(\frac{dV2}{dt}\frac{dW2}{dt} - K2_{w2V2}\right)]$$

In some electrical systems, K2 is very close to 1, and so the above equation can be simplified as:

$$V2_{comp} = V2_{measured} -$$

$$[KC_{U1V2} \times \left(\frac{dU1}{dt} - \frac{dV2}{dt}\right) + KC_{V1V2} \times \left(\frac{dV1}{dt} - \frac{dV2}{dc}\right) + KC_{W1V2} \times$$

$$\left(\frac{dW1}{dt} - \frac{dV2}{dt}\right) + KC_{U2V2} \times \left(\frac{dU2}{dt} - \frac{dV2}{dt}\right) + KC_{W2V2} \times \left(\frac{dW2}{dt} - \frac{dV2}{dt}\right)]$$

Figure 14:
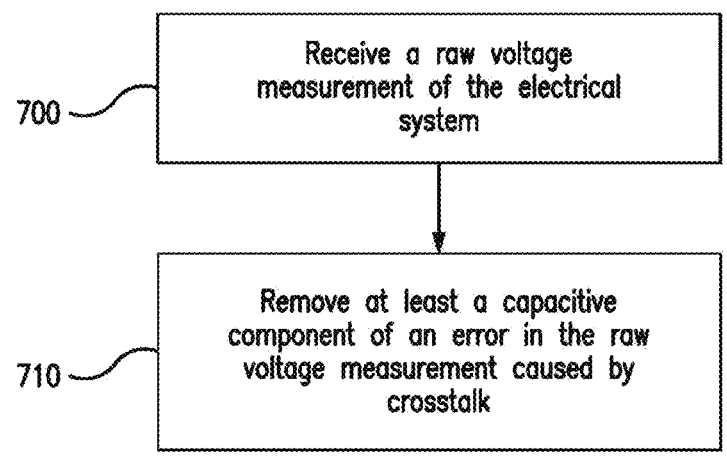
FIG. 14—shows a flowchart of a broad method of providing a compensated voltage measurement affected by crosstalk.

Accordingly, in a broad form, as shown in FIG. 14, there is provided a method of providing a compensated voltage measurement of a voltage measurement in an electrical system that includes an error from crosstalk, the method comprising, in step 700, receiving a raw voltage measurement of the electrical system; and, in step 710, removing at least a capacitive component of the error from the crosstalk to provide the compensated voltage measurement.

Figure 15:
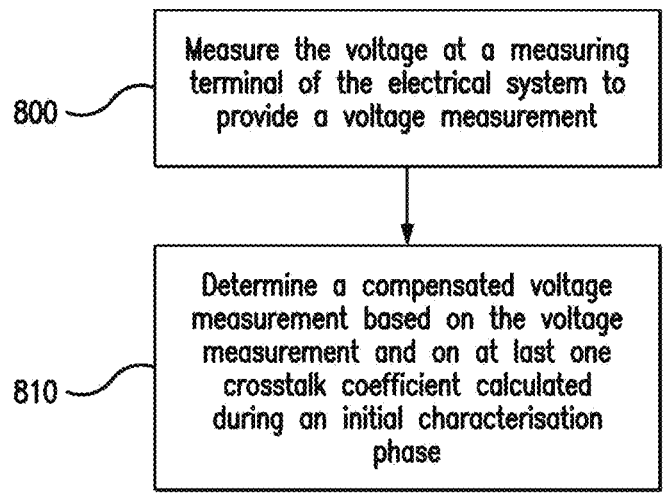
FIG. 15—shows a flowchart of a method of providing a compensated voltage measurement according to another aspect.

According to another broad aspect, as shown in FIG. 15, there is provided a method for providing a compensated voltage measurement of a voltage measurement in an electrical system, the method comprising, in step 800, measuring the voltage at a measuring terminal of the electrical system to provide the voltage measurement, and, in step 810, determining the compensated voltage measurement based on the voltage measurement and on at last one crosstalk coefficient calculated during an initial characterisation phase.

As previously described, in some embodiments, this initial characterisation phase comprises, injecting a reference voltage signal at a first terminal of the electrical system; measuring at the terminal, a capacitively coupled signal, from the reference voltage signal; comparing the reference voltage signal with a measured capacitively coupled signal; and calculating the at least one crosstalk coefficient base on the comparison of the reference voltage signal and the measured capacitively coupled signal.

Figure 16A:
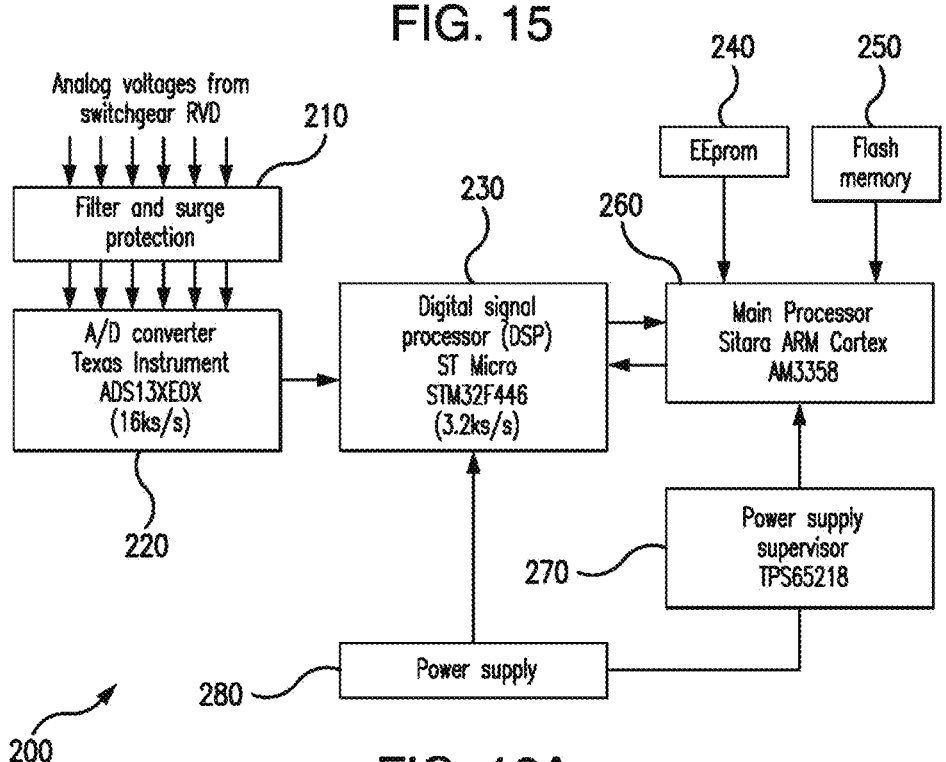
FIG. 16A—shows an embodiment of a device for carrying out the various compensation methods described herein.

According to another aspect, there is provided a controller 200 for use with the electrical system/switchgear 500 to effect the voltage compensation as described in the various aspects above. In some embodiments, as shown in FIG. 16A, the controller 200 comprises an input having a filter and surge protection unit 210 for receiving the analog voltage measurements from the terminals or bushings of the electrical system such as a switchgear, or recloser 500. These raw measurements are provided to the A/D converter, which in some embodiments, as shown in FIG. 16A is provided by device ADS13XE0X (16ks/s), provided by Texas Instruments, Inc.

The digital data is then provided to digital signal processor (DSP) 230, which in some embodiments, as shown in FIG. 16A is provided as device STM32F446 (3.2 ks/s) by the company STMicroelectronics. On this device is stored executable instructions to allow the various methods described above to be implemented, to provide compensated voltage values which can be used to store in memory, display on a display unit and/or use to control elements of the electrical system, such as in effecting a Sync Check procedure.

An example of code suitable for implementing an example of one of the methods described above is provided below:

```
/*!
****************************************************************
* @brief compensate the sampled voltage data. This required for
* E38 switches. Calculates the error using this form
* errors[U1] = KU2U1 * (dU2dU1)
* + KV1U1 * (dV1dU1)
* + KW1U1 * (dW1dU1)
* + KV2U1 * (dV2dU1)
* + KW2U1 * (dW2dU1);
* where dUx is calculated as this sample previous
sample
* Then subtracts that from the measured value
* Does this for all the bushings
*
* @note adc_v_spi.wlse_data[bushing][sample] is modified
* Also adds approximately 4% to processing load
*
****************************************************************
* @param[in] sample the
sample in play (0 to SAMPLES_PER_2P5MS)
*
****************************************************************
* @return void
*
****************************************************************
*/
```

```
inline void compensate(u3_t sample)
{
static float K[NUM_CVTs][NUM_CVTs];
static Bool first_time = true;
float dvolts[NUM_CVTs];
if (first_time)
{
first_time = false;
float src_factor = 0.032184944f / ((Ts) * 1000.0f);
float load_factor = 0.031548916f / ((Ts) * 1000.0f);
K[CVT1][CVT4] = 5.57f * src_factor;
K[CVT4][CVT1] = 1.84f * load_factor;
K[CVT2][CVT5] = 5.86f * src_factor;
K[CVT5][CVT2] = 1.99f * load_factor;
K[CVT3][CVT6] = 5.84f * src_factor;
K[CVT6][CVT3] = 1.85f * load_factor;
K[CVT1][CVT2] = 0.62f * src_factor;
K[CVT1][CVT5] = 0.19f * src_factor;
K[CVT1][CVT3] = 0.09f * src_factor;
K[CVT1][CVT6] = 0.14f * src_factor;
K[CVT2][CVT1] = 0.74f * src_factor;
K[CVT2][CVT3] = 0.74f * src_factor;
K[CVT2][CVT4] = 1.29f * src_factor;
K[CVT2][CVT6] = 0.18f * src_factor;
K[CVT3][CVT1] = 0.09f * src_factor;
K[CVT3][CVT2] = 0.42f * src_factor;
K[CVT3][CVT4] = 0.14f * src_factor;
K[CVT3][CVT5] = 1.29f * src_factor;
K[CVT4][CVT2] = 0.87f * load_factor;
K[CVT4][CVT3] = 0.12f * load_factor;
K[CVT4][CVT5] = 0.21f * load_factor;
K[CVT4][CVT6] = 0.06f * load_factor;
K[CVT5][CVT1] = 0.11f * load_factor;
K[CVT5][CVT3] = 0.95f * load_factor;
K[CVT5][CVT4] = 0.23f * load_factor;
K[CVT5][CVT6] = 0.29f * load_factor;
K[CVT6][CVT1] = 0.16f * load_factor;
K[CVT6][CVT2] = 0.14f * load_factor;
K[CVT6][CVT4] = 0.08f * load_factor;
K[CVT6][CVT5] = 0.33f * load_factor;
}
// need to do this before any error calcs as all the voltage diffs are used
for all bushings
for (size_t bushing = CVT1; bushing < NUM_CVTs; bushing++)
{
dvolts[bushing] = adc_v_spi.wlse_data[bushing][sample] adc_
v_spi.previous_sample[bushing];
adc_v_spi.previous_sample[bushing] = adc_v_spi.wlse_data[bushing][sample];
}
// Now calculate the error contribution from all other bushings for each
bushing
float v_error;
for (size_t bushing = CVT1; bushing < NUM_CVTs; bushing++)
{
v_error = 0.0f;
for (size_t other_bushing = CVT1; other_bushing < NUM_CVTs; other_bushing+
+)
{
if (other_bushing != bushing)
v_error += K[other_bushing][bushing] * (dvolts[other_bushing] dvolts
[bushing]);
}
adc_v_spi.wlse_data[bushing][sample] =
v_error;
}
}
```

The controller 200 of FIG. 16A also includes EEProm 240, Flash memory 250, and a main processor 260, which in this embodiment is provided by Sitara ARM Cortex AM3358 processor provided by Texas Instruments, Inc. The various blocks are powered by power supply 280 controlled by power supply supervisor 270, provided by device TPS65218 provided by Texas Instruments, Inc.

It will be appreciated that while specific device identifications have been provided in this embodiment, any other suitable device configurations and parts could be used as will be understood by the person skilled in the art.

Figure 16B:
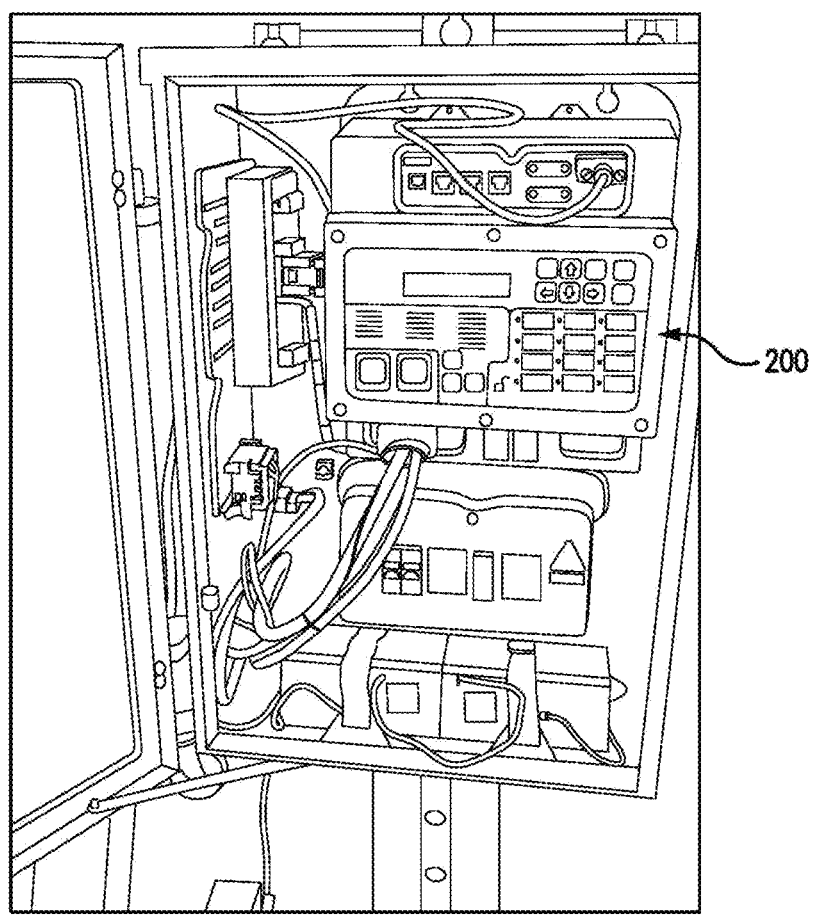
FIG. 16B—shows an example of an actual switchgear controller for use with the various aspects described herein.

FIG. 16B shows a photograph of an example switchgear controller 200 having the structure shown and described with reference to FIG. 16A.

Figure 17:
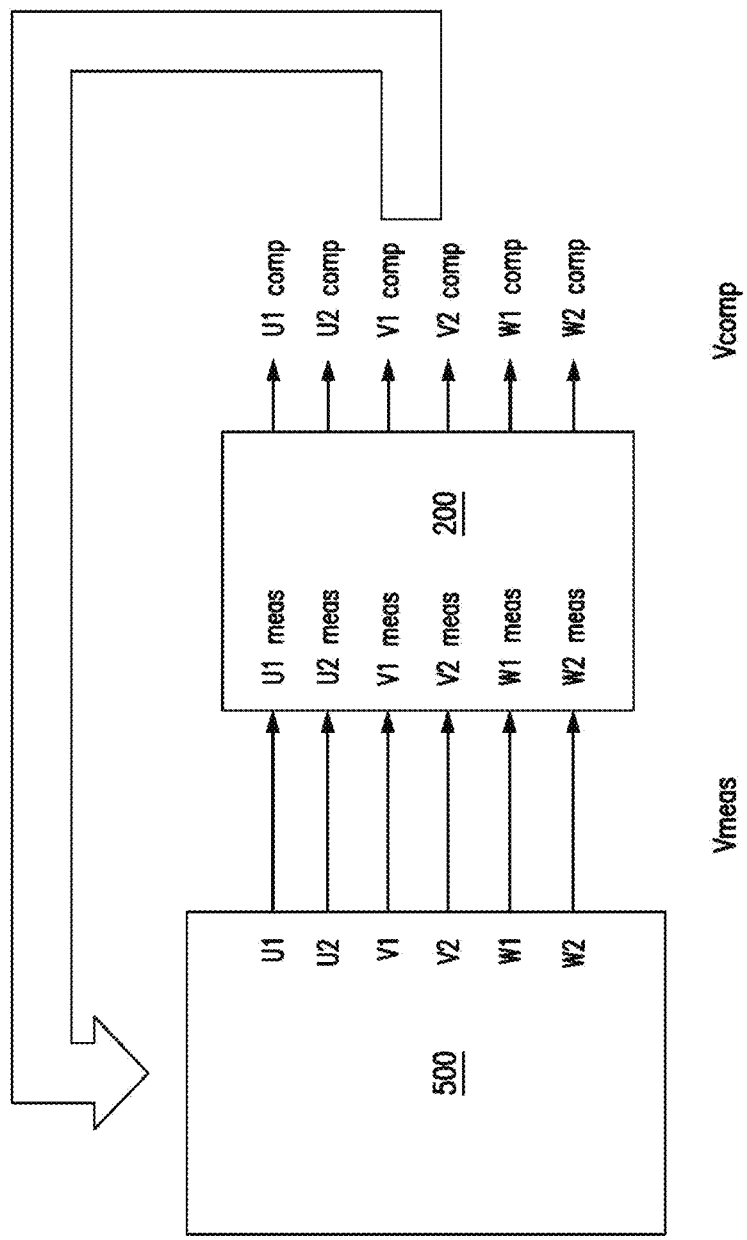
FIG. 17—shows a representation of the device of FIGS. 16A and 16B in use with an electrical system.

FIG. 17 shows an embodiment of the device 200 receiving voltage output data from electrical system 500, such as an electrical switchgear such as a recloser or RVD. FIG. 17 shows the measured voltages Vmeas for each of U1, U2, V1, V2, W1 and W2 output from electrical system 500 and input to device 200. The output of device 200 is the compensated voltage measurements Vcomp for each of U1, U2, V1, V2, W1 and W2.

In some embodiments and applications the compensated voltage measurements are then used to control aspects of the electrical system as previously described.

Figure 18A:
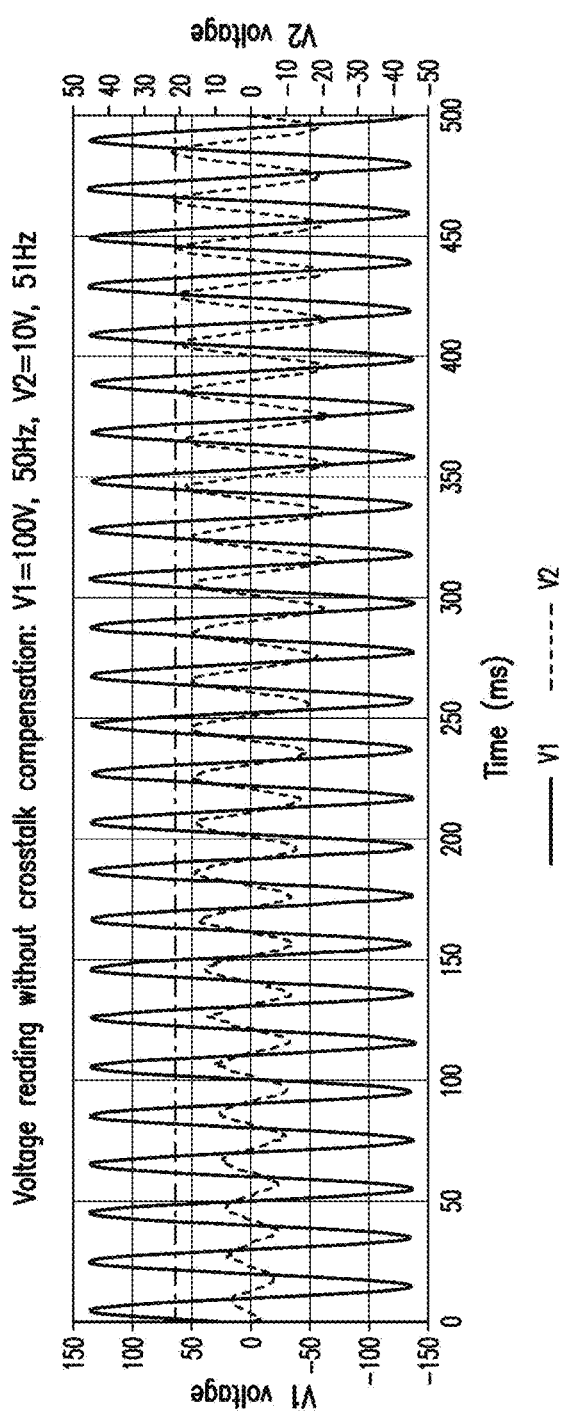
FIG. 18A—shows a waveform of a voltage measurement measured at a terminal of the electrical system containing the crosstalk error.

FIG. 18A shows a waveform of a measured voltage signal V2measured at the V2 terminal of the electrical system (which is the input to filter 210 of device 200). As will be appreciated, this measurement will contain the error E from the crosstalk from each of the other voltages V1, U1, U2, W1 and W2.

Figure 18B:
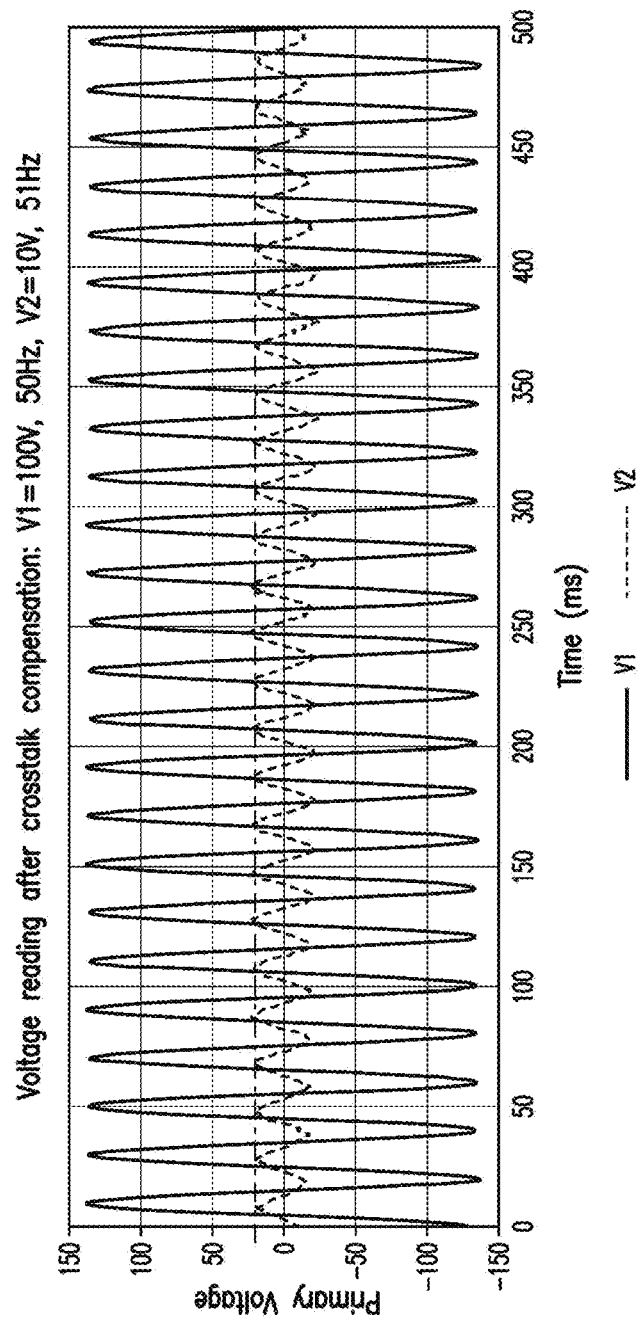
FIG. 18B—shows a waveform of the voltage measurement of FIG. 18A after being processed by the device of FIG. 15 with the crosstalk error removed.

FIG. 18B shows the compensated voltage V2comp resulting from the application of the one or more methods described above, which effectively removes the, or part of the, crosstalk error, thus providing a voltage measurement that is closer to the real voltage appearing at the V2 terminal than was measured by the device.

This compensated voltage measurement can then be used to control one or more functions of the electrical system 500 such as Sync Check, or any other function that requires an accurate measurement of the voltages.

In a broad aspect then, there is provided a device for controlling an electrical system based on one or more voltage measurements of the electrical system, the device comprising; an input for receiving data corresponding to the one or more voltage measurements; a data processor for processing the received data and for generating data corresponding to a compensated voltage measurement; and an output for controlling the electrical system according to the compensated voltage measurement; wherein the processor contains executable software for causing the processor to perform one or more of the methods described above.

In another broad aspect, there is also provided a non-transitory computer-readable medium containing executable code for causing a processor to perform one or more of the methods described above.

Derivations

As previously described, various relationships have been used to obtain the various impedances of the equivalent circuit. These relationships will now be derived with reference to FIGS. 19 and 20.

Figure 19:
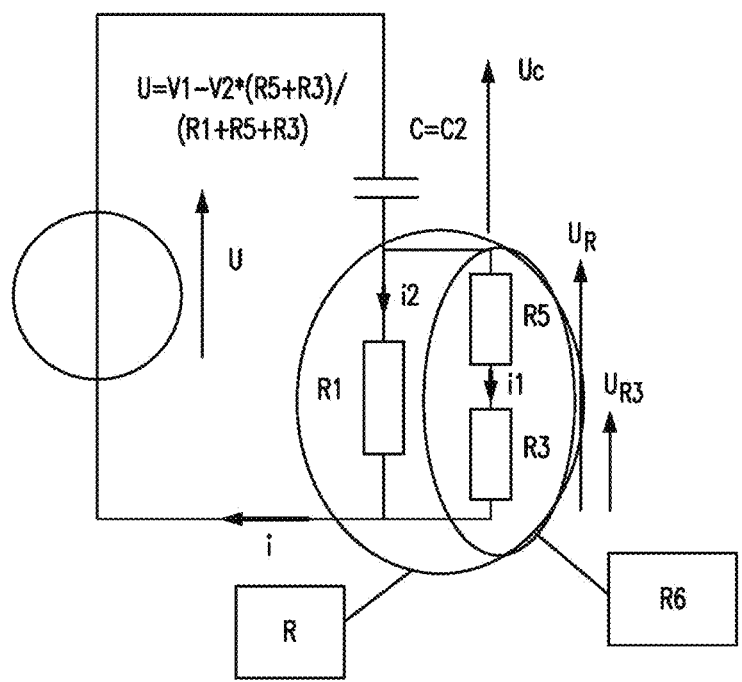
FIG. 19—shows an expanded Thevenin equivalent circuit used in deriving relationships used to calculate internal impedances.
Figure 20:
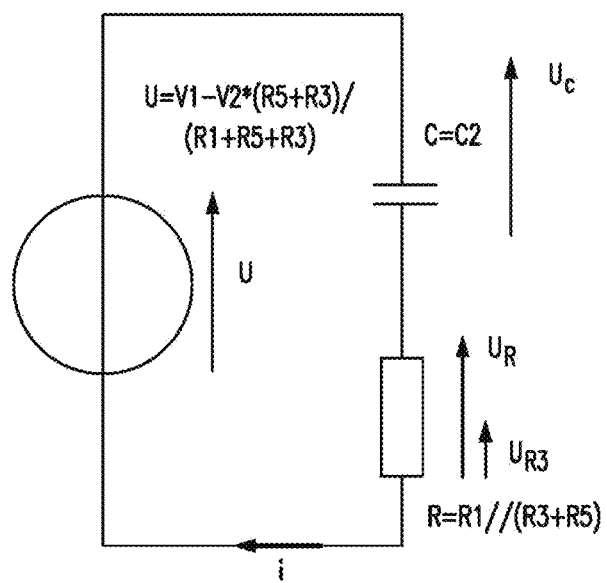
FIG. 20—shows another Thevenin equivalent circuit used in deriving relationships used to calculate internal impedances.

FIG. 19 shows an expanded Thevenin equivalent circuit of that shown in FIG. 9. Considering that R6=R3+R5, RVD=R5+R1, that R3<<RVD and that γ=R1/RVD, the following holds:
A) R6 voltage=voltage (R1//R6) {considering R1 is in parallel with R6 when V2=0}
R6·i1=i(R1·R6)/(R1+R6)
i=R6 ·i1·(R1+R6)/R1·R6 )
Therefore I=i1(RVD+R3)/R1
Considering R1=γ*RVD and R3<<RVD, it can be concluded that i1≈γ·i
B) from FIG. 18, R=R1//R6=R1*R6/(R1+R6)
With R6=R5+R3,
Since R3<<R5; R6≈R5 and R≈R1*R5/(R1+R5)
By replacing R1 and R5 with γ*RVD and (1−γ)RVD respectively,
R≈RVD*γ(1−γ), this can also be written as: γ²−γ+R/RVD=0
This quadratic equation can be solved with 2 values:

$$\gamma 1 = \frac{1 - \sqrt{1 - 4R/RVD}}{2} \text{ and } \gamma 2 = \frac{1 + \sqrt{1 - 4R/RVD}}{2}$$

$$\gamma = \frac{1 \pm \sqrt{1 - 4R/RVD}}{2} \approx \frac{i1}{i}$$

C)
$U^2 = (R*i)^2 + (Zc*i)^2$
$Zc = R*\text{Tan}(\alpha)$ With α the angle between the injected voltage and the crosstalk measured
$iZc = \sqrt{U^2 - (R \cdot i)^2}$ $$\text{Therefore} * \text{Tan}(\alpha) = \sqrt{\frac{U^2 - (R \cdot i)^2}{Ri}} \quad R = \frac{U}{i\sqrt{(\text{Tan}\,\alpha)^2 + 1}}$$

From the above, there is:

$$i1 \approx \gamma \cdot i \text{ (with } \gamma = R1/RVD\text{)} \tag{A}$$

$$\gamma = \frac{1 \pm \sqrt{1 - 4R/RVD}}{2} \tag{B}$$

$$R = \frac{U}{i\sqrt{(\text{Tan}\,\alpha)^2 + 1}} \tag{C}$$

Then, using (A) and (B), there is $$i = \frac{2 \cdot i1}{1 \pm \sqrt{1 - 4R/RVD}}$$

Then by replacing i in (C) with the equation above, there is $$R = \frac{U}{\sqrt{(\text{Tan}\,\alpha)^2 + 1}} \cdot \frac{1 \pm \sqrt{1 - 4R/RVD}}{2 \cdot i1}$$

Therefore:

$$R^2 = \frac{U^2}{2 \cdot i1^2 [(\text{Tan}\,\alpha)^2 + 1]} * \left(1 - \frac{2R}{RCD} 1 \pm \sqrt{1 - 4R/RVD}\right)$$

$$\left[\text{put } D^2 = \frac{U^2}{2 \cdot i1^2 [(\text{Tan}\,\alpha)^2 + 1]}\right], \text{then}$$

$$\frac{R^2}{D^2} = \frac{RVD - 2R \pm \sqrt{RVD(RVD - 4R)}}{RVD} \pm \sqrt{RVD(RVD - 4R)} =$$

$$RVD - \frac{R^2 \cdot RVD}{D^2} - 2R \cdot D^2$$

$$\text{Therefore: } RVD(RVD - 4R) = \left(\frac{D^2 \cdot RVD - R^2 \cdot RVD - 2R \cdot D^2}{D^2}\right)^2$$

The final equation can be simplified to: $RVD^2 \cdot R^2 + 4D^2 \cdot RVD \cdot R + 4D^4 - 2D^2 RVD^2 = 0$ $$R = \frac{-4D^2 \cdot RVD \pm \sqrt{8D^2 \cdot RVD^4}}{2RVD^2}$$

but R can only be positive and so the actual result is:

$$R = \frac{-4D^2 \cdot RVD + D \cdot RVD^2 \cdot \sqrt{8}}{2RVD^2}$$

with $$D = \frac{U^2}{2 \cdot 1^2 \left[(\tan\alpha)^2 + 1\right]}$$

From there, all of the components can be calculated as follows:
UR3=PV1V2*R3/RVD with PV1V2=crosstalk percentage from V1 to V2 when V2 is shorted to ground
i1=UR3/R3 (We know UR3 and R3)

$$R = \frac{-4D^2 \cdot RVD + D \cdot RVD^2 \cdot \sqrt{8}}{2RVD^2} \text{ with } D = \frac{U^2}{2 \cdot i1^2 \left[(\tan\alpha)^2 + 1\right]}$$

$$Zc = R \cdot \tan(\alpha)$$

$$i = U \Big/ \sqrt{(R^2 + Zc^2)}$$

$$\Upsilon \approx i1/i \quad \left(\text{With: } \Upsilon = \frac{R1}{RVD}\right)$$

$$R1 = \Upsilon \cdot RVD$$

$$R5 = RVD - R1$$

The crosstalk compensation algorithm in its various forms described above works by simulating the error, then removing it from the measured value. This simulation can be simplified to only include one pole and the effect of one side to the other (e.g. V1 on V2). The different calculations for each pole pairing can then be combined in the algorithm as previously described.

The algorithm is based on the following equations, which are based on the Thevenin model of FIG. 19:
U=V1−V2*(R3+R5)/(R1+R3+R5)

$i=(U-Uc)/R$[with $U(0)=0$)]

$\int (i \cdot dt)$[=previous $i+i(t)*0.001*t$ (ms)]

$Uc=(1/C)*\int (i \cdot dt)$[using$\int (i \cdot dt)$ calculated up to the previous sample]

From there, the error measured is calculated as E(t)=R1·(i)t.

The following demonstrates the calculation of the factor K1dV1/dtMax=V1Max.

The capacitive crosstalk on V2 due to a voltage applied on V1, k is called kV1V2

$$kV1V2 = k1 * PV1V2$$

With:

$$kV1V2 = \frac{V2 \text{ Crosstalk max}}{\left(\frac{dV_1}{dt}\right)\text{max}}$$

PV1V2=V2 Crosstalk percentage from V1 on V2 (Here PV1V2=5.86 as the crosstalk is 5.86% V1 when V2=0)
K1=The factor required to make $$K1 \times \frac{dV1}{dt}$$

the same amplitude as 1% of $$V1\left(K1\frac{dV1}{dt}\text{Max} = 1\% \, V1\text{Max}\right)$$

Factor K1 can be calculated as below:
The original signal of amplitude A is V1(t)=A·sin(ωt)
Considering the signal has a frequency f, V1(t)=A·sin(2π·f·t)
So the derivative of this signal is DV1(t)=A·2π·f·cos(2π·f·t)
In order to have the same amplitude as V1, DV1 must be multiplied by a factor of by factor 1/(2π·f)
Considering t is in milliseconds, in order to have the same amplitude as V1, for 100% of V1, DV1 must be multiplied by factor 1000/2π·f
In order to get the same amplitude as 1% of V1, DV1 must be multiplied by factor $$k1 = \frac{1000}{100} 2\pi \cdot f$$

So since a 50 Hz signal during calibration is used, k1=10/2π·f=0.03183, and for 5.86% crosstalk, kV1V2=5.86×0.03183=0.187

While the above has generally been described with reference to electrical switchgear and/or medium to high voltage applications, it will be appreciated that the various aspects are equally applicable to other applications including low voltage applications, audio systems, communication systems and medical equipment, where crosstalk can affect voltage measurements of one or more points in the system and used when any analog circuit is not perfectly isolated from noise, and the source of the noise is sampled. This could be to increase measurement accuracy for a multitude of applications including automotive electronics, avionics and sensors.

It will also be appreciated that the various methods and systems described can be used to compensate for crosstalk induced by currents instead of voltage capacitive coupling.

Those of skill in the art would understand that information and signals may be represented using any of a variety of technologies and techniques. For example, data, instructions, commands, information, signals, bits, symbols, and chips may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software or instructions, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the aspects described herein.

The steps of a method or algorithm described in connection with the embodiments disclosed herein may be embodied directly in hardware, in a software module executed by a processor, or in a combination of the two. For a hardware implementation, processing may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. Software modules, also known as computer programs, computer codes, or instructions, may contain a number a number of source code or object code segments or instructions, and may reside in any computer readable medium such as a RAM memory, flash memory, ROM memory, EPROM memory, registers, hard disk, a removable disk, a CD-ROM, a DVD-ROM, a Blu-ray disc, or any other form of computer readable medium. In some aspects the computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media. In another aspect, the computer readable medium may be integral to the processor. The processor and the computer readable medium may reside in an ASIC or related device. The software codes may be stored in a memory unit and the processor may be configured to execute them. The memory unit may be implemented within the processor or external to the processor, in which case it can be communicatively coupled to the processor via various means as is known in the art.

Further, it should be appreciated that modules and/or other appropriate means for performing the methods and techniques described herein can be downloaded and/or otherwise obtained by computing device. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a computing device can obtain the various methods upon coupling or providing the storage means to the device. Moreover, any other suitable technique for providing the methods and techniques described herein to a device can be utilized.

In one form one aspect may comprise a computer program product for performing the method or operations presented herein. For example, such a computer program product may comprise a computer (or processor) readable medium having instructions stored (and/or encoded) thereon, the instructions being executable by one or more processors to perform the operations described herein. For certain aspects, the computer program product may include packaging material.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The system may be a computer implemented system comprising of a display device, a processor and a memory and an input device. The memory may comprise instructions to cause the processor to execute a method described herein. The processor memory and display device may be included in a standard computing device, such as a desktop computer, a portable computing device such as a laptop computer or tablet, or they may be included in a customised device or system. The computing device may be a unitary computing or programmable device, or a distributed device comprising several components operatively (or functionally) connected via wired or wireless connections. An embodiment of a computing device comprises a central processing unit (CPU), a memory, a display apparatus, and may include an input device such as keyboard, mouse, etc. The CPU comprises an Input/Output Interface, an Arithmetic and Logic Unit (ALU) and a Control Unit and Program Counter element which is in communication with input and output devices (eg input device and display apparatus) through the Input/Output Interface. The Input/Output Interface may comprise a network interface and/or communications module for communicating with an equivalent communications module in another device using a predefined communications protocol (e.g. Bluetooth, Zigbee, IEEE 802.15, IEEE 802.11, TCP/IP, UDP, etc). A graphical processing unit (GPU) may also be included. The display apparatus may comprise a flat screen display (eg LCD, LED, plasma, touch screen, etc), a projector, CRT, etc. The computing device may comprise a single CPU (core) or multiple CPU's (multiple core), or multiple processors. The computing device may use a parallel processor, a vector processor, or be a distributed computing device. The memory is operatively coupled to the processor(s) and may comprise RAM and ROM components, and may be provided within or external to the device. The memory may be used to store the operating system and additional software modules or instructions. The processor(s) may be configured to load and executed the software modules or instructions stored in the memory.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

The reference to any prior art in this specification is not, and should not be taken as, an acknowledgement of any form of suggestion that such prior art forms part of the common general knowledge.

It will be appreciated by those skilled in the art that the various aspects are not restricted in their use to the particular application described. Neither are they restricted in the embodiments described with regard to the particular elements and/or features described or depicted herein. It will be appreciated that the various aspects are not limited to the embodiment or embodiments disclosed, but is capable of numerous rearrangements, modifications and substitutions without departing from the scope as set forth and defined by the following claims.

The invention claimed is:

1. A method for providing a compensated voltage measurement of a voltage measurement in an electrical system, the method comprising:
  measuring the voltage at a measuring terminal of the electrical system to provide the voltage measurement,
  determining the compensated voltage measurement based on the voltage measurement and on at least one crosstalk coefficient calculated during an initial characterisation phase, the at least one crosstalk coefficient being determined from characteristic measurements of the electrical system, wherein the characteristic measurements include a K value and an α value and the initial characterisation phase comprises:
  injecting a reference voltage signal at a first terminal of the electrical system;
  measuring a voltage at the measuring terminal, while coupled to earth, of a capacitively coupled signal, from the reference voltage signal, wherein the K value is a ratio of amplitude of the injected reference voltage signal and the measured capacitively coupled signal and the α value is a phase angle difference between the injected reference voltage and the measured voltage of the capacitively coupled signal; and calculating the at least one crosstalk coefficient based on the K value and the α value; and using the compensated voltage measurement determined to obtain in real time accurate measurements to control the electrical system.

2. The method as claimed in claim 1 wherein the compensated voltage measurement includes an error from crosstalk and wherein the compensated voltage measurement is determined by removing at least a capacitive component of the error from the crosstalk to provide the compensated voltage measurement.

3. The method as claimed in claim 2 wherein the capacitive component is determined by multiplying a capacitance coefficient by a variation in voltage with respect to a previously-measured one of the voltage measurement.

4. The method as claimed in claim 3 wherein the capacitance coefficient is determined by $K \sin(\alpha)$.

5. The method as claimed in claim 3 wherein the capacitance coefficient is determined from impedance values obtained from a characterised equivalent circuit of the electrical system.

6. The method as claimed in claim 5 comprising applying the function:

$$V2_{comp} = V2_{measured} - \left[ KC_{U1V2} \times \left( \frac{dU1}{dt} - \frac{dV2}{dt} \right) + \right.$$
$$KC_{V1V2} \times \left( \frac{dV1}{dt} - \frac{dV2}{dt} \right) + KC_{W1V2} \times \left( \frac{dW1}{dt} - \frac{dV2}{dt} \right) +$$
$$\left. KC_{U2V2} \times \left( \frac{dU2}{dt} - \frac{dV2}{dt} \right) + KC_{W2V2} \times \left( \frac{dW2}{dt} - \frac{dV2}{dt} \right) \right]$$

Where:
KCU1V2 is the capacitance coefficient of the effect of U1 on V2;
KCV1V2 is the capacitance coefficient of the effect of V1 on V2;
KCW1V2 is the capacitance coefficient of the effect of W1 on V2;
KCU2V2 is the capacitance coefficient of the effect of U2 on V2;
KCW2V2 is the capacitance coefficient of the effect of W2 on V2;
dU1/dt is the voltage variation between the voltage measurement U1 and a previously-measured voltage measurement U1;
dV2/dt is the voltage variation between the voltage measurement V2 and a previously-measured voltage measurement V2;
dV1/dt is the voltage variation between the voltage measurement V1 and a previously-measured voltage measurement V1;
dW1/dt is the voltage variation between the voltage measurement W1 and a previously-measured voltage measurement W1;
dU2/dt is the voltage variation between the voltage measurement U2 and a previously-measured voltage measurement U2; and
dW2/dt is the voltage variation between the voltage measurement W2 and a previously-measured voltage measurement W2.

7. The method as claimed in claim 5 comprising applying the function:

$$V2_{comp} = V2_{measured} - \left[ KC_{U1V2} \times \left( \frac{dU1}{dt} - K2_{U1V2} \frac{dV2}{dt} \right) + \right.$$
$$KC_{V1V2} \times \left( \frac{dV1}{dt} - K2_{V1V2} \frac{dV2}{dt} \right) + KC_{W1V2} \times \left( \frac{dW1}{dt} - K2_{W1V2} \frac{dV2}{dt} \right) +$$
$$\left. KC_{U2V2} \times \left( \frac{dU2}{dt} - K2_{u2V2} \frac{dV2}{dt} \right) + KC_{W2V2} \times \left( \frac{dW2}{dt} - K2_{W1V2} \right) \right]$$

Where:
KCU1V2 is the capacitance coefficient of the effect of U1 on V2;
KCV1V2 is the capacitance coefficient of the effect of V1 on V2;
KCW1V2 is the capacitance coefficient of the effect of W1 on V2;
KCU2V2 is the capacitance coefficient of the effect of U2 on V2;
KCW2V2 is the capacitance coefficient of the effect of W2 on V2;
dU1/dt is the voltage variation between the voltage measurement U1 and a previously-measured voltage measurement U1;
dV2/dt is the voltage variation between the voltage measurement V2 and a previously-measured voltage measurement V2;
dV1/dt is the voltage variation between the voltage measurement V1 and a previously-measured voltage measurement V1;
dW1/dt is the voltage variation between the voltage measurement W1 and a previously-measured voltage measurement W1;
dU2/dt is the voltage variation between the voltage measurement U2 and a previously-measured voltage measurement U2;
dW2/dt is the voltage variation between the voltage measurement W2 and a previously-measured voltage measurement W2;
K2U1V2 is the coefficient factor of the effect of V2 on error $E_{U1V2}$;
K2V1V2 is the coefficient factor of the effect of V2 on error $E_{V1V2}$;
K2W1V2 is the coefficient factor of the effect of W1 on V2;
K2U2V2 is the coefficient factor of the effect of U2 on V2; and
K2W2V2 is the coefficient factor of the effect of W2 on V2.

8. The method as claimed in claim 2 further comprising removing a resistive component of the error.

9. The method as claimed in claim 8 wherein the resistive component is determined by $K \cos(\alpha)$.

10. The method as claimed in claim 8 comprising applying the function:

$$V2comp = V2measured -$$
$$\left[ KcU1V2 * \frac{dU1-dV2}{dt} + KcV1V2 * \frac{dV1-dV2}{dt} + \right.$$
$$KcW1V2 * \frac{dW1-dV2}{dt} + KcU2V2 * \frac{dU2-dV2}{dt} +$$
$$KcW2V2 * \frac{dW2-dV2}{dt} + \frac{U1-V2}{KRU1V2} + \frac{V1-V2}{KRV1V2} + \frac{W1-V2}{KRW1V2} +$$
$$\left. \frac{U2-V2}{KRU2V2} + \frac{W2-V2}{KRW2V2} \right]$$

Where:

V2comp is the compensated voltage measurement of the measurement of V2;

V2measured is the voltage measured;

KcU1V2 is the capacitance coefficient determined for the effect of U1 on V2;

KcV1V2 is the capacitance coefficient determined for the effect of V1 on V2;

KcW1V2 is the capacitance coefficient determined for the effect of W1 on V2;

KcU2V2 is the capacitance coefficient determined for the effect of U2 on V2;

KcW2V2 is the capacitance coefficient determined for the effect of W2 on V2;

dU1/dt is the voltage variation between the voltage measurement U1 and a previously-measured voltage measurement U1;

dV2/dt is the voltage variation between the voltage measurement V2 and a previously-measured voltage measurement V2;

dV1/dt is the voltage variation between the voltage measurement V1 and a previously-measured voltage measurement V1;

dW1/dt is the voltage variation between the voltage measurement W1 and a previously-measured voltage measurement W1;

dU2/dt is the voltage variation between the voltage measurement U2 and a previously-measured voltage measurement U2;

dW2/dt is the voltage variation between the voltage measurement W2 and a previously-measured voltage measurement W2;

U1 is the measured voltage U1;
V1 is the measured voltage V1;
V2 is the measured voltage V2;
W1 is the measured voltage W1;
U2 is the measured voltage U2;
W2 is the measured voltage W2;

KRU1V1 is the resistance coefficient determined for the effect of U1 on V1;

KRV1V2 is the resistance coefficient determined for the effect of V1 on V2;

KRW1V2 is the resistance coefficient determined for the effect of W1 on V2;

KRU2V2 is the resistance coefficient determined for the effect of U2 on V2; and

KRW2V2 is the resistance coefficient determined for the effect of W2 on V2.

11. The method as claimed in claim 2 comprising applying the following function:

$$V2comp = V2measured -$$
$$\left[ KcU1V2 * \frac{dU1 - k2U1V2*dV2}{dt} + KcV1V2 * \frac{dV1 - k2V1V2d*V2}{dt} + \right.$$
$$KcW1V2 * \frac{dW1 - k2W1V2*dV2}{dt} + KcU2V2 * \frac{dU2 - k2U2V2*dV2}{dt} +$$
$$\left. KcW2V2 * \frac{dW2 - k2W2V2*dV2}{dt} \right]$$

Where:

V2comp is the compensated voltage measurement of the measurement of V2;

V2measured is the voltage measured;

KcU1V2 is the capacitance coefficient determined for the effect of U1 on V2;

KcV1V2 is the capacitance coefficient determined for the effect of V1 on V2;

KcW1V2 is the capacitance coefficient determined for the effect of W1 on V2;

KcU2V2 is the capacitance coefficient determined for the effect of U2 on V2;

KcW2V2 is the capacitance coefficient determined for the effect of W2 on V2;

dU1/dt is the voltage variation between the voltage measurement U1 and a previously-measured voltage measurement U1;

dV2/dt is the voltage variation between the voltage measurement V2 and a previously-measured voltage measurement V2;

dV1/dt is the voltage variation between the voltage measurement V1 and a previously-measured voltage measurement V1;

dW1/dt is the voltage variation between the voltage measurement W1 and a previously-measured voltage measurement W1;

dU2/dt is the voltage variation between the voltage measurement U2 and a previously-measured voltage measurement U2; and dW2/dt is the voltage variation between the voltage measurement W2 and a previously-measured voltage measurement W2.

12. The method as claimed in claim 2 wherein the error is provided by $$E = Kc \cdot \left( \frac{dV1}{dt} - k2 \cdot \frac{dV2}{dt} \right)$$

Where:

E is the error from the crosstalk on V2 by V1;

Kc is the capacitance coefficient of the error;

K2 is a component of the error;

dV1/dt is the variation in voltage V1 with respect to a the previously-measured voltage V1 in sampling time dt; and dV2/dt is the variation in voltage V2 with respect to a the previously-measured voltage V2 in sampling time dt.

13. The method as claimed in claim 1 wherein the at least one crosstalk coefficient corresponds to a capacitive component of the comparison of the reference voltage signal and the measured capacitively coupled signal.

14. A device configured to control an electrical system based on one or more voltage measurements of the electrical system, the device comprising:
an input configured to receive data corresponding to the one or more voltage measurements;
a data processor configured to process the received data and generate data corresponding to a compensated voltage measurement;
an output configured to control the electrical system according to the compensated voltage measurement; and
a memory storing executable software configured to cause the processor to perform the method of claim 1.

15. A computer program product comprising a non-transitory computer-readable medium storing executable code configured to cause a processor to perform the method as claimed in claim 1.

16. The method as claimed in claim 1 further comprising repeating the steps of claim 1 for each terminal pairing to obtain a paired-terminal-specific K value and angle value α for each terminal pair.

17. A method for providing a compensated voltage measurement of a voltage measurement in an electrical system, the method comprising:
  measuring the voltage at a measuring terminal of the electrical system to provide the voltage measurement,
  determining the compensated voltage measurement based on the voltage measurement and on at least one crosstalk coefficient calculated during an initial characterisation phase, the at least one crosstalk coefficient being determined from characteristic measurements of the electrical system, wherein the initial characterisation phase comprises:
  injecting a reference voltage signal at a first terminal of the electrical system;
  measuring at the measuring terminal, a capacitively coupled signal, from the reference voltage signal;
  comparing the reference voltage signal with the measured capacitively coupled signal; and
  calculating the at least one crosstalk coefficient based on the comparison of the reference voltage signal and the measured capacitively coupled signal; and
  using the compensated voltage measurement determined to obtain in real time accurate measurements to control the electrical system,
  wherein the compensated voltage measurement includes an error from crosstalk and wherein the compensated voltage measurement is determined by removing at least a capacitive component of the error from the crosstalk to provide the compensated voltage measurement, wherein the error is provided by $$E = Kc. \left( \frac{dV1}{dt} - k2. \frac{dV2}{dt} \right)$$

Where:
E is the error from the crosstalk on V2 by V1;
Kc is the capacitance coefficient of the error;
K2 is a component of the error;
dV1/dt is the variation in voltage V1 with respect to a the previously-measured voltage V1 in sampling time dt; and
dV2/dt is the variation in voltage V2 with respect to a the previously-measured voltage V2 in sampling time dt.

18. A device configured to control an electrical system based on one or more voltage measurements of the electrical system, the device comprising:
  an input configured to receive data corresponding to the one or more voltage measurements;
  a data processor configured to process the received data and generate data corresponding to a compensated voltage measurement;
  an output configured to control the electrical system according to the compensated voltage measurement; and
  a memory storing executable software configured to cause the processor to perform the method of claim 17.

19. A computer program product comprising a non-transitory computer-readable medium storing executable code configured to cause a processor to perform the method as claimed in claim 17.

* * * * *